(12) United States Patent
Ing et al.

(10) Patent No.: US 8,382,337 B2
(45) Date of Patent: Feb. 26, 2013

(54) LIGHTING DEVICE, LIGHT SPREADING PLATE AND METHOD FOR MANUFACTURING THE SAME

(75) Inventors: Wen-Chiun Ing, Taipei County (TW); Wei-Hsin Hou, Taipei (TW); Zhi-Wei Koh, Hsinchu County (TW); Chi-Jen Kao, Taipei (TW)

(73) Assignee: Luxingtek, Ltd., Hsinchu County (TW)

( * ) Notice: Subject to any disclaimer, the term of this patent is extended or adjusted under 35 U.S.C. 154(b) by 90 days.

(21) Appl. No.: 12/879,173

(22) Filed: Sep. 10, 2010

(65) Prior Publication Data

US 2011/0069496 A1  Mar. 24, 2011

Related U.S. Application Data

(60) Provisional application No. 61/243,793, filed on Sep. 18, 2009.

(51) Int. Cl.
*F21V 3/00* (2006.01)
(52) U.S. Cl. ............ 362/311.03; 362/311.02; 362/311.1; 362/326; 313/361.1
(58) Field of Classification Search ............. 362/311.02, 362/311.03, 311.1, 326; 313/361.1
See application file for complete search history.

(56) References Cited

U.S. PATENT DOCUMENTS

| | | | |
|---|---|---|---|
| 6,679,621 B2 | 1/2004 | West et al. | |
| 7,246,931 B2 | 7/2007 | Hsieh et al. | |
| 7,414,270 B2 | 8/2008 | Kim et al. | |
| 7,585,083 B2 | 9/2009 | Kim et al. | |
| 2006/0138437 A1 | 6/2006 | Huang et al. | |
| 2006/0208269 A1 | 9/2006 | Kim et al. | |
| 2006/0291205 A1 | 12/2006 | Jeon | |
| 2008/0030986 A1 | 2/2008 | Ogawa et al. | |
| 2008/0151551 A1 | 6/2008 | Yang et al. | |
| 2008/0303757 A1 | 12/2008 | Ohkawa et al. | |
| 2009/0225550 A1 | 9/2009 | Yamaguchi | |

FOREIGN PATENT DOCUMENTS

| | | |
|---|---|---|
| CN | 101046576 A | 10/2007 |
| CN | 101206280 A | 6/2008 |

OTHER PUBLICATIONS

Search Report and Written opinion for PCT counterpart Patent Application No. PCT/CN2010/077039, Dec. 16, 2010, 13 pages.
English language Abstract for CN101206280A, 1 page.
English language Abstract for CN101046576A, 1 page.

*Primary Examiner* — Meghan Dunwiddie
(74) *Attorney, Agent, or Firm* — Skaar Ulbrich Macari, P.A.

(57) ABSTRACT

A lighting device, a light spreading plate for the lighting device and a method for manufacturing the same are provided. The lighting device comprises a light source plate and the light spreading plate. The light source plate comprises a plurality of light sources. The light spreading plate comprises a light travelling layer formed with a plurality of light spreading units. Each of the light spreading units is formed with a main body being defined with a top surface, a bottom surface and a peripheral. The main body has a thickness being tapered towards the peripheral. The main body comprises a top surface having a cone-shaped recess and a bottom surface having a bowl-shaped recess. The cone-shaped recess and the bowl-shaped recess of each of the spreading units are opposite to each other, and one of the cone-shaped recess and bowl-shaped recess is fitted for one of the light sources.

27 Claims, 41 Drawing Sheets

LIGHTING DEVICE, LIGHT SPREADING PLATE AND METHOD FOR MANUFACTURING THE SAME

PRIORITY

This application claims priority benefit of U.S. Provisional Patent Application Ser. No. 61/243,793, filed Sep. 18, 2009, which is hereby incorporated herein by reference in its entirety.

FIELD

The present invention relates to lighting devices with a light spreading plate being able to guide light from a light source and provide a uniform surface light within an ultra thin configuration.

BACKGROUND

The conventional direct-lit backlight module used for a display comprises LEDs directly disposed under the display panel. To enhance the uniformity, usually a diffuser plate or an optical lens being disposed in front of the LEDs is needed. Although the direct-lit backlight module is suitable for the large-scale displays, it can be well imagined that the direct-lit backlight module is too costly to add optical lens to each individual LED light sources but also too thick since a certain distance is needed for the diffuser plate to be disposed above the light sources in order to obtain an uniform light output over a large area. In other words, the direct-lit backlight module faces a dilemma to provide a uniform brightness or a thinner configuration.

Given the above, a lighting device being slim and providing uniform backlight is needed.

SUMMARY

Objectives of certain embodiments of the invention include providing a light spreading plate for a lighting device having a plurality of light sources and providing a method for manufacturing the light spreading plate. The light spreading plate comprises a plurality of cone-shaped recesses being disposed with respect to the light sources. The cone-shaped recess assists light generated from a light source traveling away from the overhead region of the light source and towards the peripheral region. The cone-shaped recess could be filled with a light diffusing material which can be used to adjust the intensity of the light output closer to the central region of the light source by adjusting the depth of the cone-shaped recess and the diameter of the cone-shaped recess so that the uniformity of overall light output of the entire device can be further improved.

The light spreading plate can guide light from a light source to provide a uniform surface light within an ultra thin configuration. Pieces of the light spreading plates can be assembled with each other onto a substrate having light sources and a light scattering layer to provide a lighting device. The lighting device can be utilized in various applications including LCD backlight modules, signboards, general lightings, light boxes, etc.

More specifically, the light spreading plate can be manufactured by using a mold with a plurality of cavities to form a light traveling layer with a plurality of units. The light traveling layer is made of a transparent or translucent material. Each of the units has a cone-shaped recess being formed at the top face thereof and being filled with light diffusing materials.

The light spreading plate can be arranged onto the substrate, on which the light sources, e.g. LEDs, are bonded and the light scattering layer is coated, so as to facilitate generating a uniform surface light within an ultra thin configuration.

Further objectives of certain embodiments of the invention includes providing a lighting device and providing a method for manufacturing the lighting device. The lighting device has a light spreading plate with a matt top surface. The light spreading plate is adapted to help the light generated from the LEDs to travel within the light spreading plate and be uniformly outwards projected without using any conventional diffuser. Thus, the overall thickness of the product can be significantly reduced.

To achieve the abovementioned objectives, certain embodiments of the present invention disclose a light spreading plate. The light spreading plate comprises a light traveling layer including a plurality of light spreading units. Each of the light spreading units has a main body being defined with a top surface, a bottom surface and a peripheral. The main body has a thickness being tapered towards the peripheral. The top surface is formed with a first recess and the bottom surface is formed with a second recess opposite to the first recess. One of the first recess and second recess is utilized to accommodate a light source.

A light device is also disclosed. The lighting device comprises a light source plate and a light spreading plate being disposed onto the light source plate. The light source plate has a substrate, an electrode layer patterned on the substrate, and a plurality of light sources bonded to be electrically connected with the electrode layer. The light spreading plate comprises a light traveling layer including a plurality of light spreading units. Each of the light spreading units has a main body being defined with a top surface, a bottom surface and a peripheral. The main body has a thickness being tapered towards the peripheral. The top surface is formed with a first recess and the bottom surface is formed with a second recess opposite to the first recess. One of the first recess and second recess is utilized to accommodate one of the light sources so that the first recess and the second recess of each of the light spreading units are disposed with respect to one of the light sources when the light spreading plate is disposed onto the light source plate.

Further disclosed is a method for manufacturing the light spreading plate. The method comprises the following steps: providing a first mold being formed with a plurality of cavities, wherein each of the cavities has a plurality of angular surfaces; providing a second mold having a top surface being formed with a plurality of protrusions; injection molding a polymeric material between the first mold and the second mold to form a light traveling layer with a plurality light spreading units, wherein each of the light spreading units is formed with a dome-shaped body, the dome-shaped body comprises a top surface having a cone-shaped recess molded by the cavity and a bottom surface having a bowl-shaped recess molded by the protrusion, the cone-shaped recess and the bowl-shaped recess of each of the light spreading units are opposite to each other, and one of the cone-shaped recess and the bowl-shaped recess is utilized to accommodate a light source; and removing the first mold and the second mold.

Additionally disclosed is a method for manufacturing a lighting device. The method comprises the following steps: providing a mold being formed with a plurality of cavities, wherein each of the cavities has a plurality of angular surface; filling each of cavities with a polymeric material to form a light traveling layer with a plurality light spreading units, wherein each of the light spreading units is formed an upside-down dome-shaped body, and the dome-shaped body comprises a top surface having a cone-shaped recess; inverting the light source plate onto the mold so that the light sources are embedded in the light traveling layer with respect to the cone-shaped recess of the light spreading units before the polymeric material being cured; and removing the mold.

The detailed technology and preferred embodiments implemented for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

DETAILED DESCRIPTION

In the following descriptions, the present invention will be explained with reference to various example embodiments; nevertheless, these embodiments are not intended to limit the present invention to any specific environment, embodiment, example, applications, or particular implementations described in these example embodiments. Therefore, descriptions of these example embodiments are only provided for purpose of illustration but not to limit the present invention. It should be appreciated that elements unrelated directly to the present invention are omitted from the example embodiments and the attached drawings.

Figure 1:
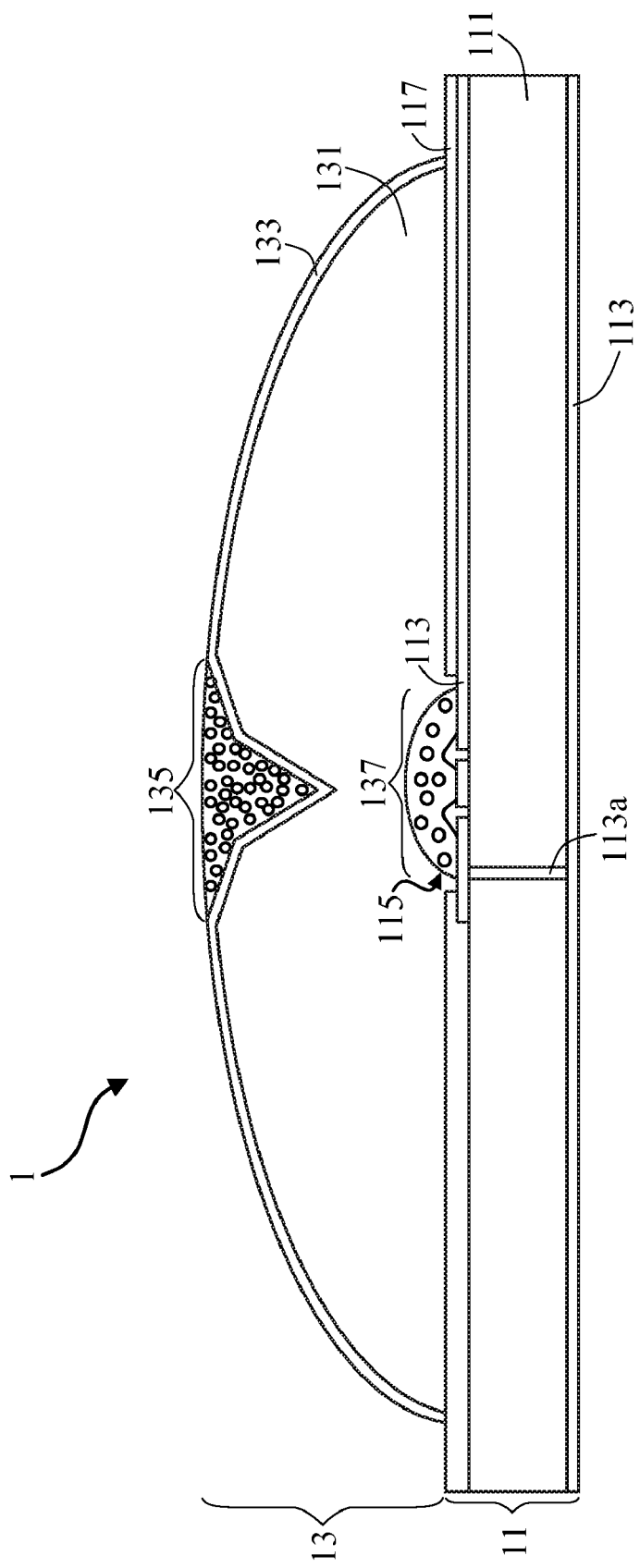
FIG. 1 is the cross-sectional view illustrating the lighting device in accordance with a first embodiment of the present invention.

Certain embodiments of the present invention relate to a lighting device, for example, a direct-lit backlight module. FIG. 1 illustrates the cross-sectional view of the lighting device 1 in accordance with the first embodiment of the present invention. The lighting device 1 comprises a light source plate 11 and a light spreading plate 13. The light source plate 11 comprises a substrate 111, an electrode layer 113, a light source 115 and a light scattering layer 117.

The substrate 111 can be a printed circuit board (PCB) or a flexible printed circuit board (FPC). Alternatively, the substrate 111 can also be made of plastic, glass, ceramic, aluminum or polymer composites. The electrode layers 113 is patterned onto two surfaces, the top surface and the bottom surface, of the substrate 111 and being electrically connected through a via hole 113a. The electrode layers 113 can be made of Cu, Ag, Ni, Au, Al or conductive inks such as silver paste, copper paste or carbon black paste.

The light source 115, e.g. a LED die or a LED die encapsulated by encapsulant, is wire bonded or flip chip bonded to be electrically connected with the electrode layer 113. The encapsulant includes any conventional glue being dispensed on to the LED dice to enclosed and protect the LED dice. The encapsulant could be made of transparent or semi-transparent polymer resins such as polyurethane based polymer, epoxy based polymer, silicon based polymer, acrylic polymer, polyethylene, polystyrene, polycarbonate, PMMA, ABS, thermal curable material, or UV curable material. The encapsulant could also be made of transparent polymer materials containing light scattering particles such as titanium dioxide particles, calcium carbonate particles, silica oxide particles, aluminum oxide particles, zinc oxide particles, tin oxide particles, germanium oxide particles, polymeric particles with differentiable refractive index, air microvoids or the combination thereof. Alternatively, the encapsulant could be made of a phosphor material for converting UV, blue or other color light emitted from the LED dice into white light. The light source 115 can also be a SMD type LED which can be electrically connected to the electrode layer 113 by a conventional SMT process.

The light scattering layers 117 can be made of transparent or semi-transparent resins, for example, a polymer resin containing light scattering particles such as titanium dioxide (e.g. a commercial white color paints), calcium carbonate particles, silica oxide particles, aluminum oxide particles, zinc oxide particles, tin oxide particles, germanium oxide particles, polymeric particle with differentiable refractive index, or air microvoids. The light scattering layer 117 can be sprayed or coated onto the substrate 111 and the electrode layer 113 on areas outside the light source 115 so as to reflect and scatter the light generated from the light source 115 to enhance the utilization of the light.

The light spreading plate 13 is disposed on the substrate 111 of the light source plate 11. The light spreading plate 13 comprises a light traveling layer 131 which is formed with a plurality of light spreading units and coated with a light scattering layer 133. Each of the light spreading units is formed with a main body being defined with a top surface, a bottom surface and a peripheral. The thickness of the main body is tapered towards the peripheral. As shown in FIG. 1, in this embodiment, the main body is a dome-shaped body comprising a first recess, e.g. a cone-shaped recess 135, formed on the top surface of the dome-shaped body and filled with light diffusing materials. The configuration of the cone-shaped recess 135 has a plurality of angular surfaces. In addition, the dome-shaped body also has a second recess, e.g. a bowl-shape recess 137, formed on a bottom surface of the dome-shaped body being utilized to accommodate the light source 115.

The light traveling layer 131 can be made of any type of transparent (or translucent) polymeric materials such as silicon rubber, polyurethane, polystyrene, polyester, polycarbonate, polyimide, polyacrylic resin, polymethylmethacrylate (PMMA), acrylonitrile butadiene styrene (ABS), polyvinylchloride (PVC), polyethylene (PE), polypropylene (PP) or a combination thereof. The light scattering layer 133 is coated onto the light traveling layer 131 and is made of, for example, a polymer resin containing titanium dioxide particles, calcium carbonate particles, silica oxide particles, aluminum oxide particles, zinc oxide particles, tin oxide particles, germanium oxide particles, polymeric particles with differentiable refractive index, air microvoids or the combination thereof. The light diffusing material used to fill up the cone-shaped recess 135 is made of transparent polymer materials containing light scattering particles such as titanium dioxide particles, calcium carbonate particles, silica oxide particles, aluminum oxide particles, zinc oxide particles, tin oxide particles, germanium oxide particles, metallic particles, or air microvoids or a mixture of plurality types of particles. The refractive index of the light diffusion material is preferred to be different from the light traveling layer 131. Moreover, the refractive index of the light diffusion material is preferred to be lower than the light traveling layer 131.

Since the majority of light generated from the light source travels along the normal of the substrate 111, the cone-shaped recess 135 formed at the top of each of the light spreading units of the light traveling layer 131 assists guiding the light departing from the normal of the substrate 111 and towards the peripheral of the dome-shaped body of the light spreading units. Light that still travels through the cone-shaped recess 135 can be further scattered by the light diffusing material filled within the cone-shaped recess 135. As a result, the light generated from the light source 115 can be uniformized.

Figure 2:
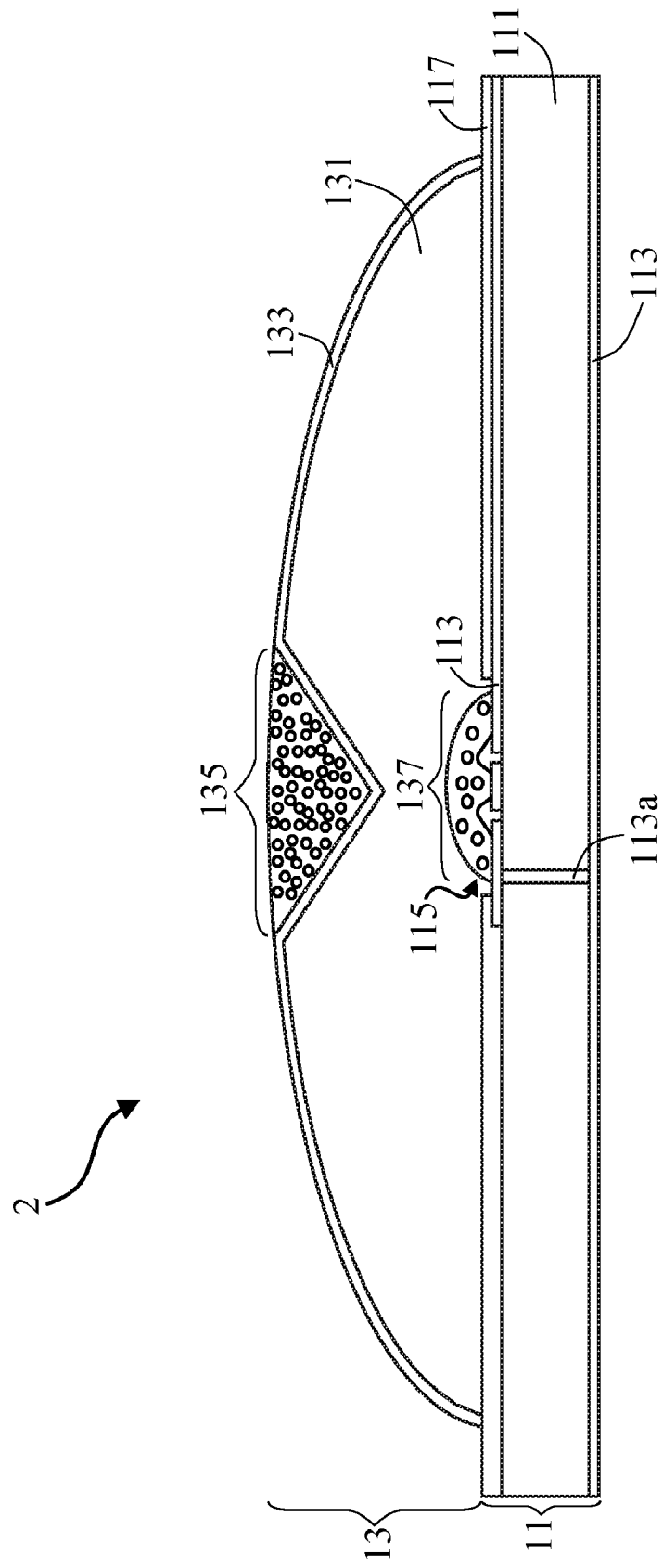
FIG. 2 is the cross-sectional view illustrating the lighting device in accordance with a second embodiment.

FIGS. 2 to 7 illustrate various embodiments with the different light spreading plate. FIG. 2 is the cross-sectional view of the lighting device 2 in accordance with the second embodiment. In comparison with the first embodiment, the configuration of the cone-shaped recess 135 in the second embodiment is different. In the second embodiment, the configuration of the cone-shaped recess 135 only has a single angular surface, but not multiple angular surfaces as shown in the first embodiment so that the sectional view of the cone-shaped recess 135 looks like triangle. It is noted that the tip of the cone-shaped recess 135 can be sharp or rounded.

Figure 3:
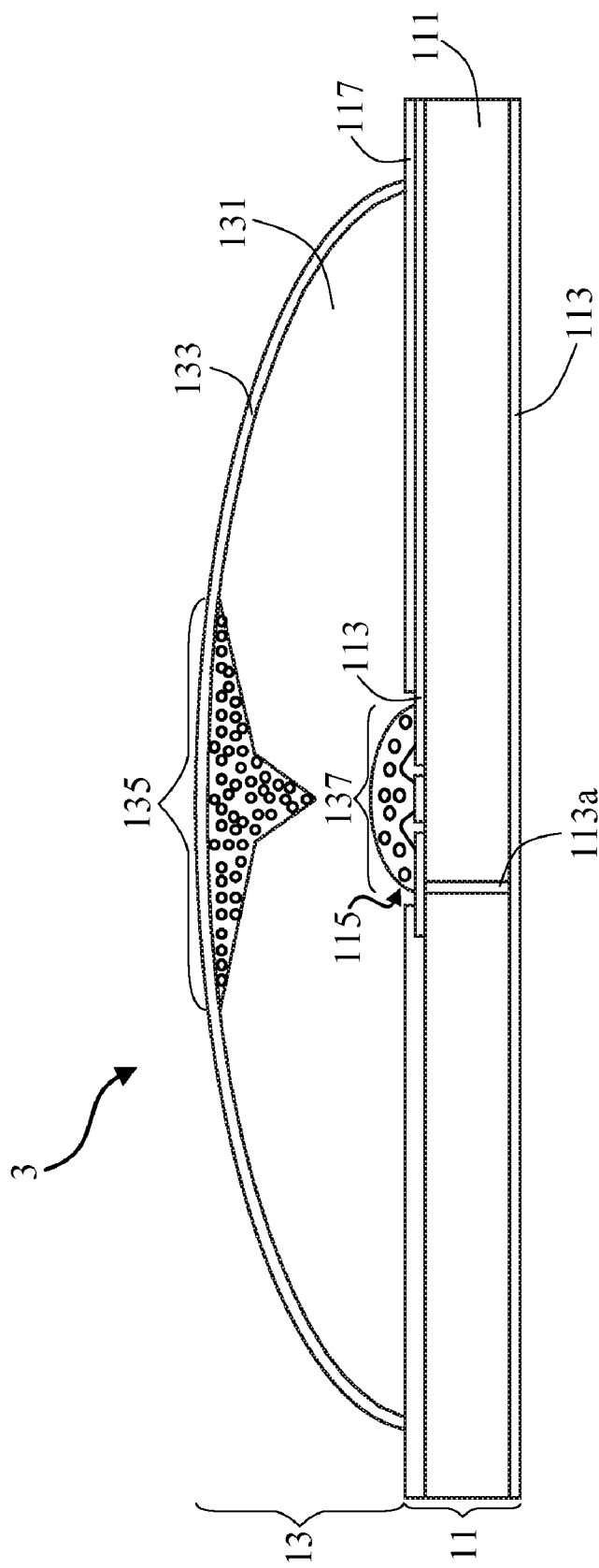
FIG. 3 is the cross-sectional view illustrating the lighting device in accordance with a third embodiment.
Figure 4:
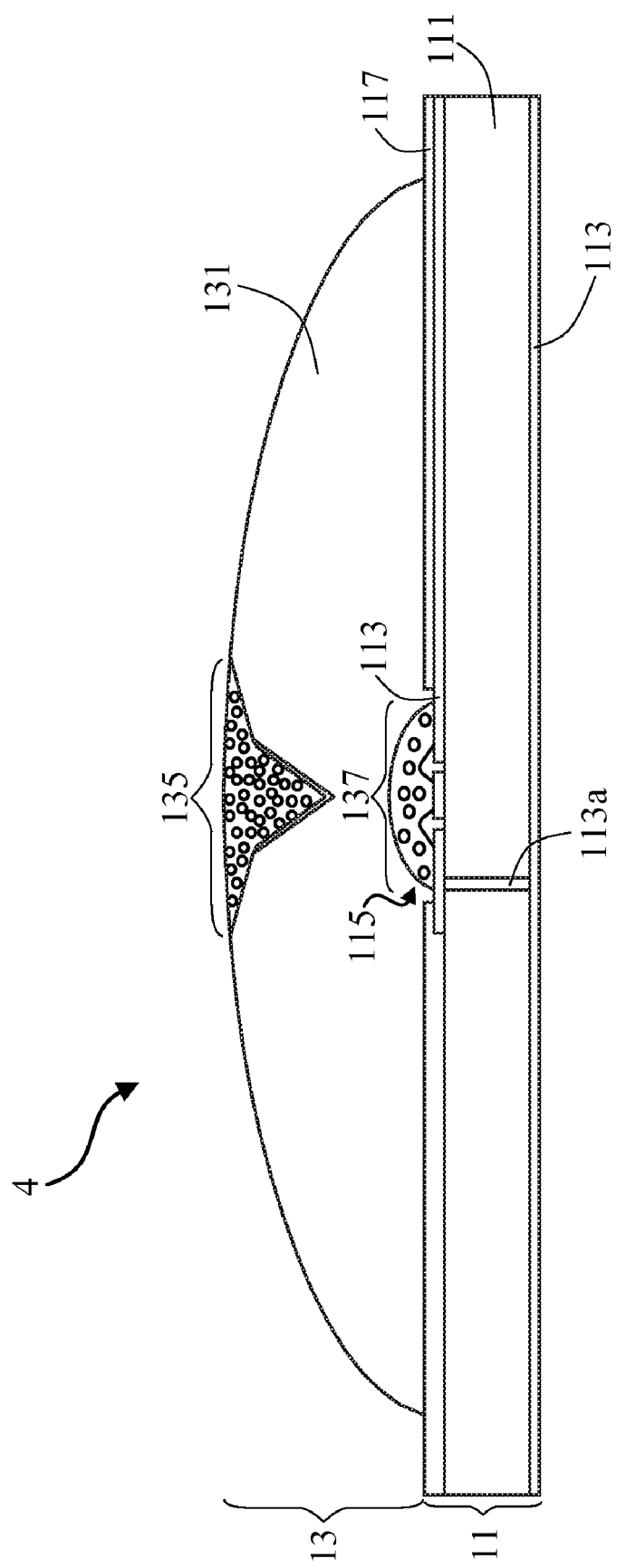
FIG. 4 is the cross-sectional view illustrating the lighting device in accordance with a fourth embodiment.
Figure 5:
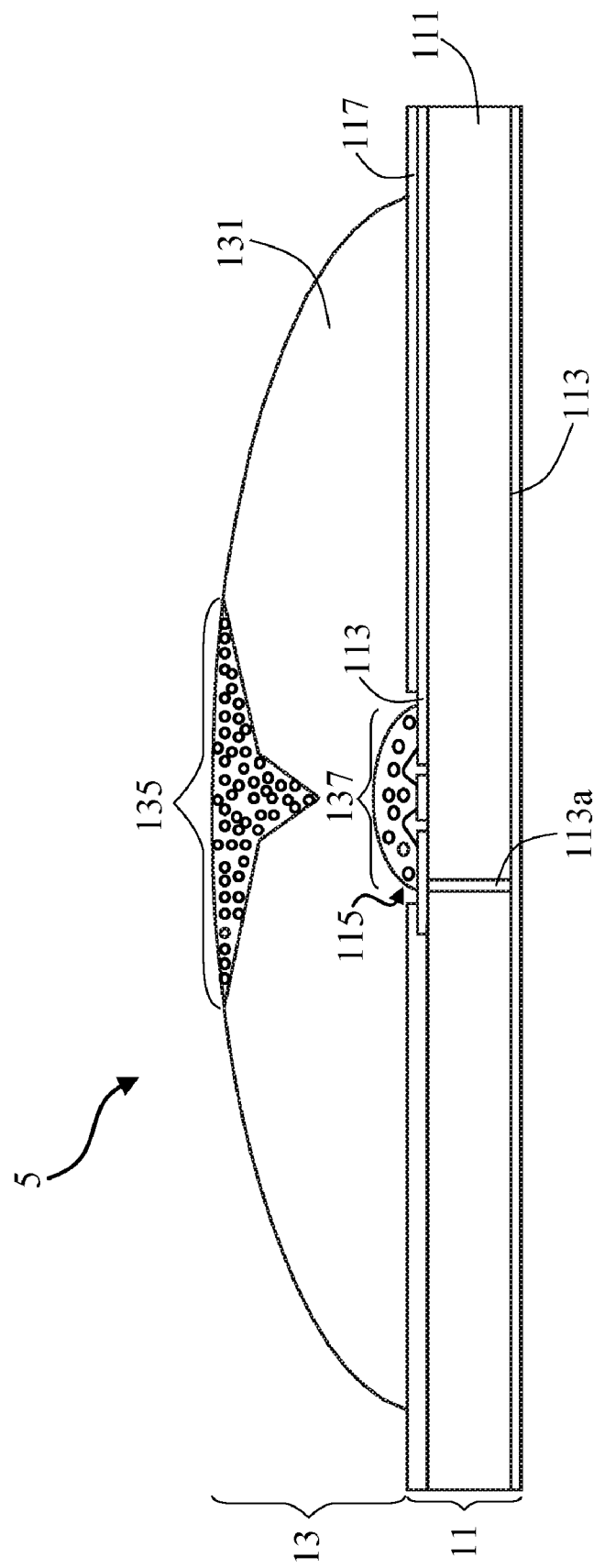
FIG. 5 is the cross-sectional view illustrating the lighting device in accordance with a fifth embodiment.

FIG. 3 is the cross-sectional view of the lighting device 3 in accordance with the third embodiment, which shows the light scattering layer 133 of the light spreading plate 13 is coated onto the light traveling layer 131 after the light diffusing material is filled within the cone-shaped recess 135. In the next embodiment, i.e. the fourth embodiment, it can be noted that the light scattering layer 133 is not absolutely necessary. FIG. 4 is the cross-sectional view of the lighting device 4 in accordance with the fourth embodiment, in which a light spreading plate 13 without the light scattering layer 133 is disposed on the light source plate 11. Due to the refractive index of the light traveling layer 131 being about 1.5 and the refractive index of air being about 1, light traveling from light traveling layer 131 to the air will be refracted, reflected or scattered. FIG. 5 is the cross-sectional view of the lighting device 5 in accordance with the fifth embodiment. In comparison with the fourth embodiment, the configuration of the cone-shaped recess 135 of the fifth embodiment is varied in different slope.

Figure 6:
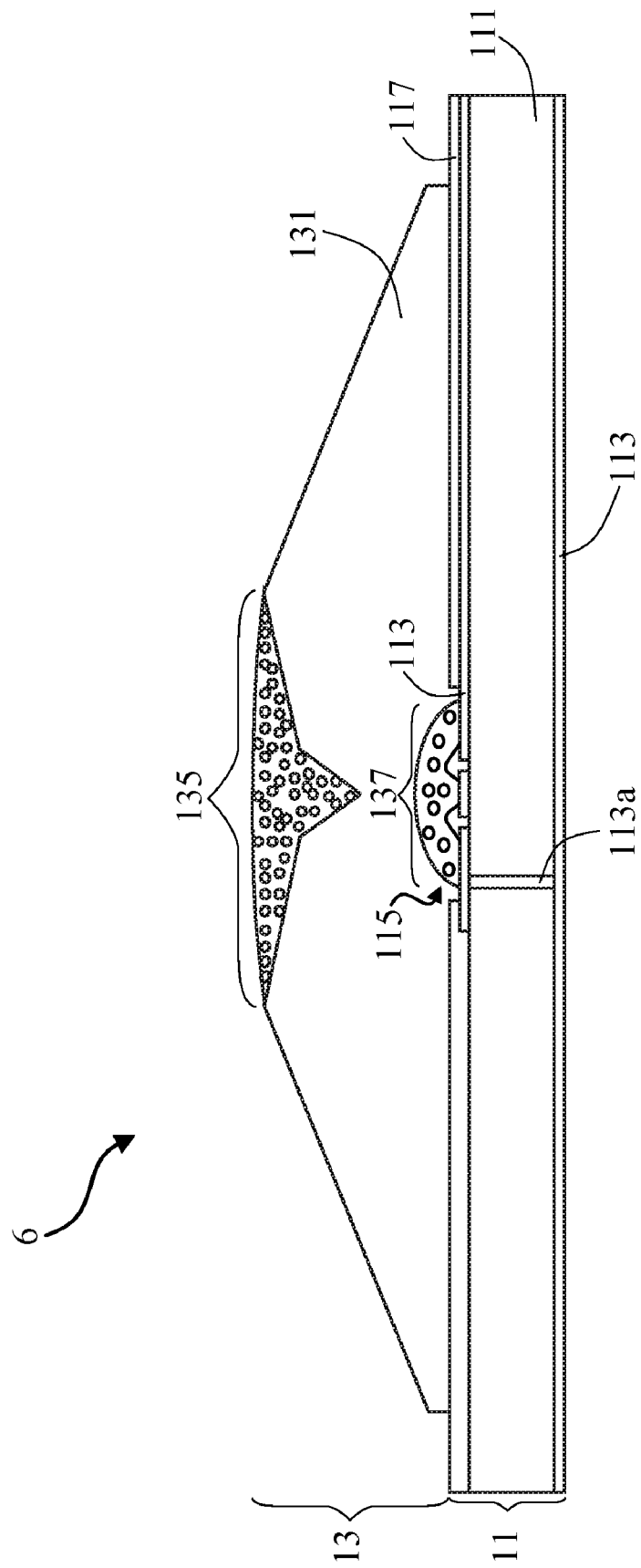
FIG. 6 is the cross-sectional view illustrating the lighting device in accordance with a sixth embodiment.
Figure 7:
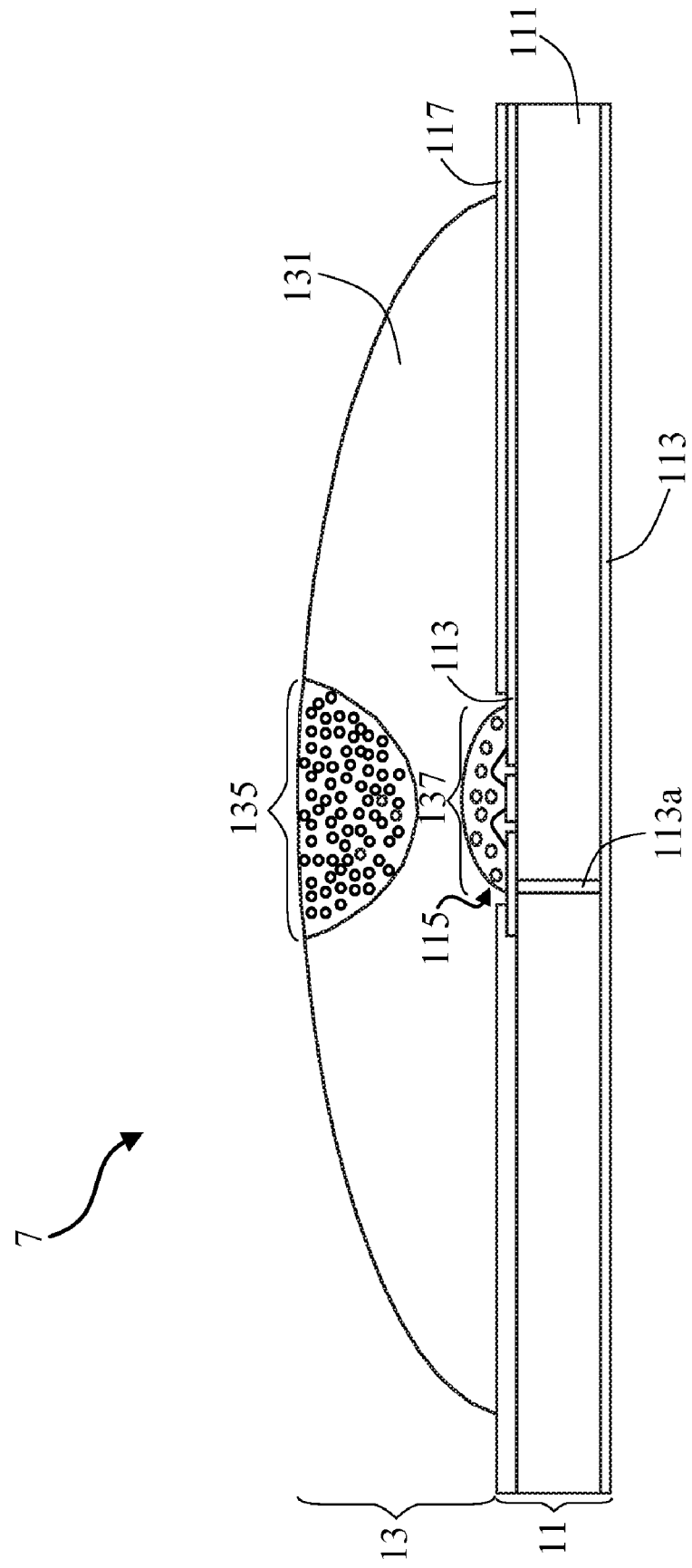
FIG. 7 is the cross-sectional view illustrating the lighting device in accordance with a seventh embodiment.

The light traveling layer 131 can be formed with other configurations. FIG. 6 is the cross-sectional view of the lighting device 6 in accordance with the sixth embodiment, which shows the light traveling layer 131 having a polyhedron configuration. In comparison with the FIG. 1 to FIG. 5, the light traveling layer 131 illustrated in FIG. 6 has the upper surface being not cambered but inclined. FIG. 7 is the cross-sectional view of the lighting device 7 in accordance with the seventh embodiment, in which the cone-shaped recess 113 is smoothed as a bowl.

Figure 8A:
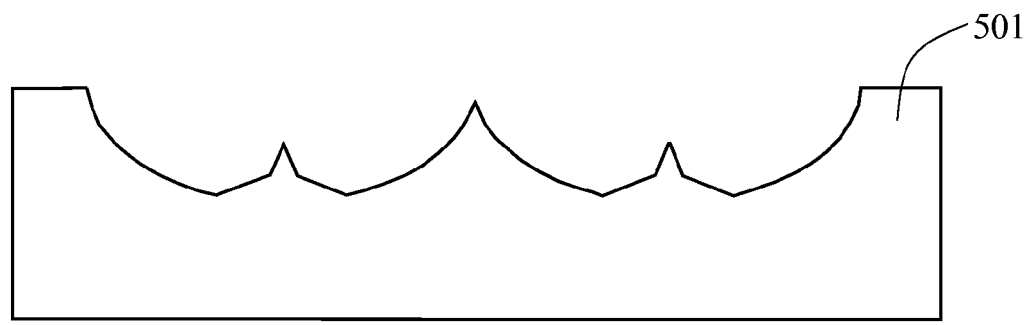
FIGS. 8A to 8F are schematic views illustrating an eighth embodiment of the present invention.
Figure 8B:
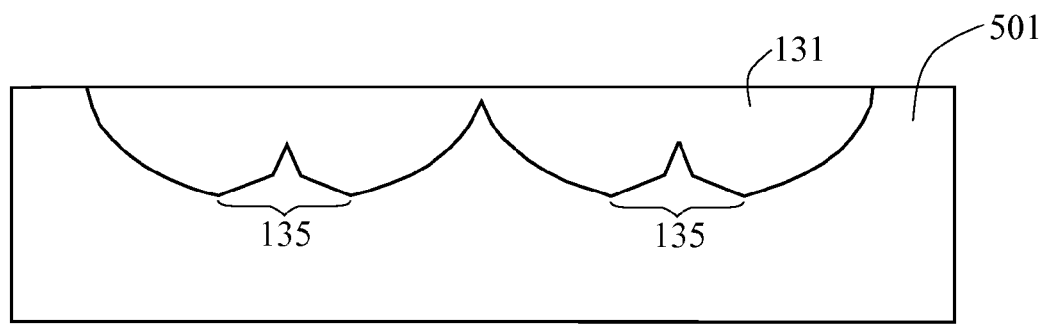
Figure 8C:
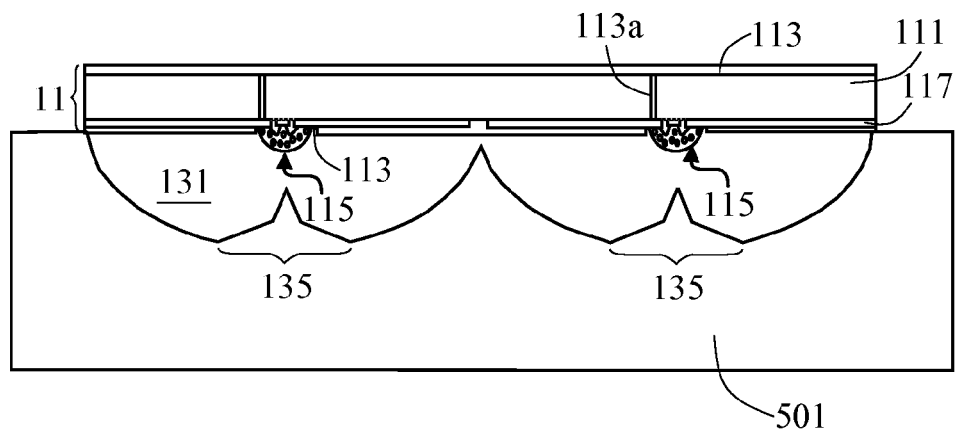
Figure 8D:
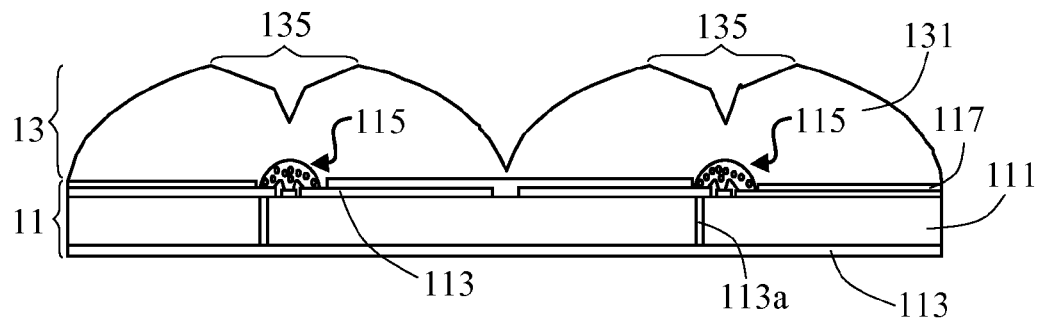
Figure 8E:
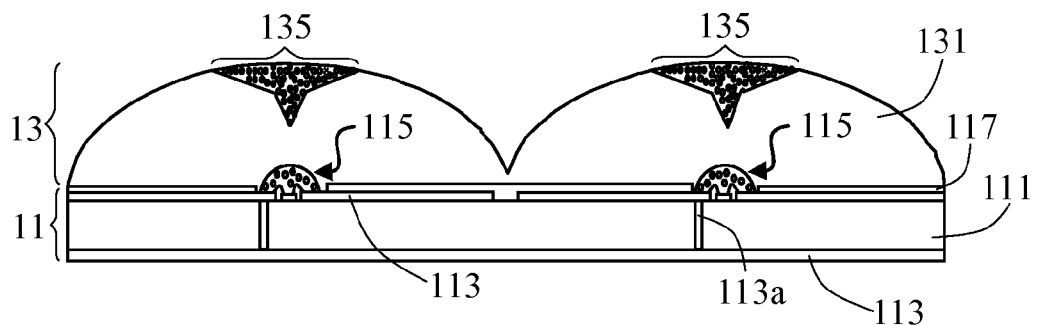
Figure 8F:
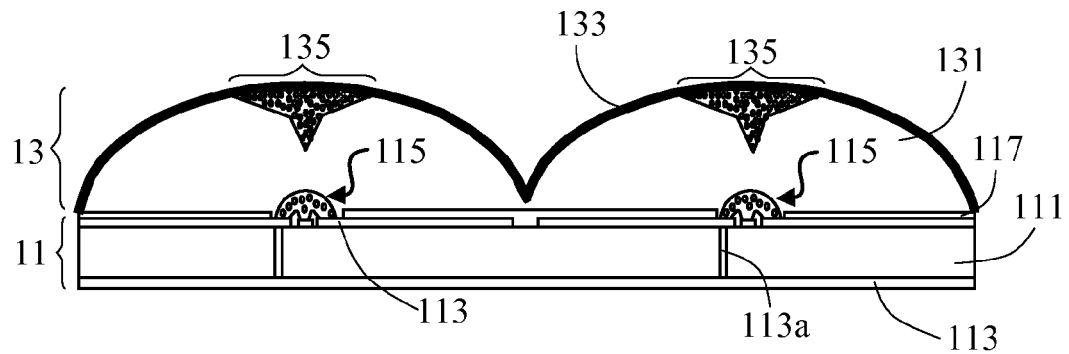

The eighth embodiment of the present invention relates to a method for manufacturing the lighting device 3 of the third embodiment. First, as shown in FIG. 8A, a mold 501 is provided. The mold 501 is formed with a plurality of cavities having a plurality of angular surfaces at the bottom. Next, as shown in FIG. 8B, a transparent or translucent polymeric material is applied into the mold 501 to form a light traveling layer 131 of a light spreading plate with a plurality of light spreading units, wherein each of the light spreading units has a configuration of upside-down dome-shaped body on which a cone-shaped recess 135 is formed. In FIG. 8C, a light source plate having the substrate 101, the light sources 105, e.g. LED dies encapsulated with encapsulant, the electrode layers 103 and the light scattering layer 117, is inverted onto the mold 501. In this manner, the LED dies and encapsulants can be embedded in the light traveling layer 131 and the top surface of the substrate 101 is contact with the light traveling layer 131 before the transparent (or translucent) polymeric material being cured. In FIG. 8D, the transparent (or translucent) polymeric material is then cured to form the light traveling layer 131, and the mold 501 is subsequently removed. In FIG. 8E, light diffusing materials are filled with the cone-shaped recess 135 of each of the light spreading units. Finally, as shown in FIG. 8F, the light scattering layer 133 is coated onto the light traveling layer 131.

Figure 9A:
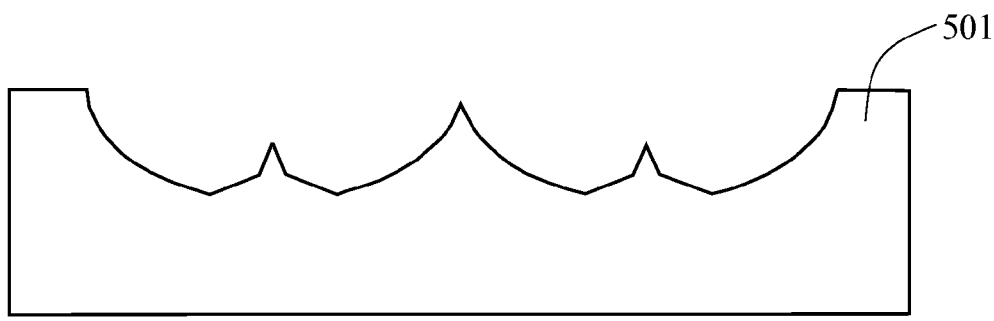
FIGS. 9A to 9F are schematic views illustrating a ninth embodiment of the present invention.
Figure 9B:
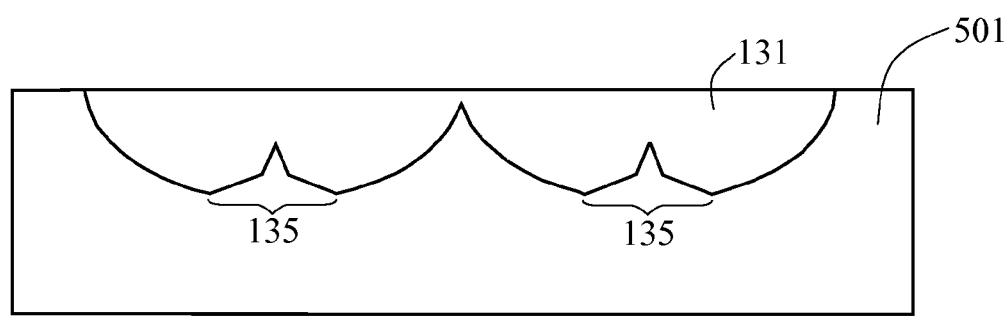
Figure 9C:
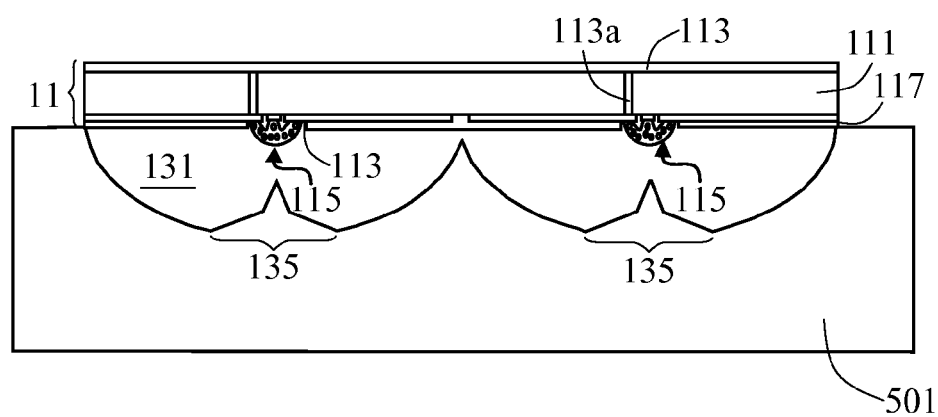
Figure 9D:
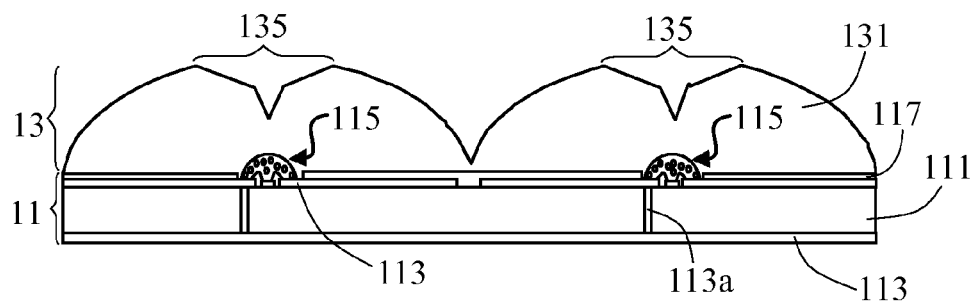
Figure 9E:
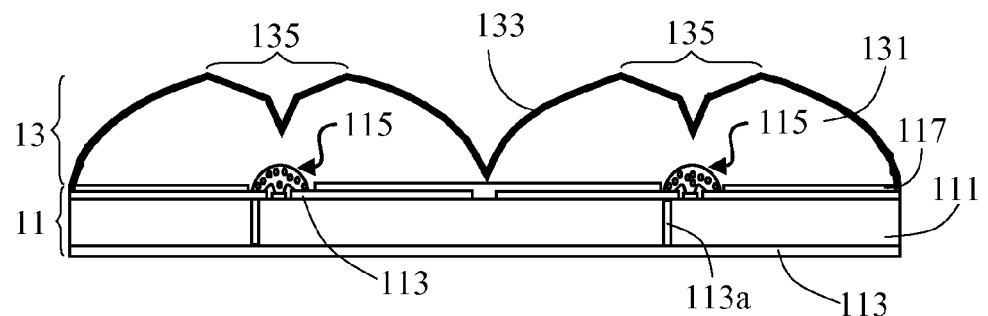
Figure 9F:
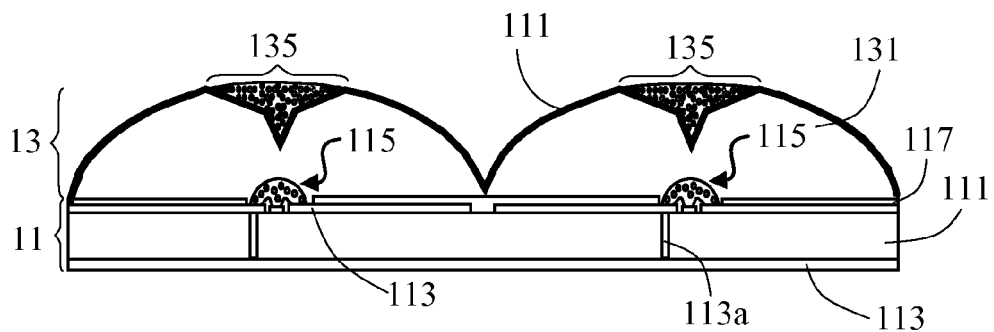

The ninth embodiment of the present invention relates to a method for manufacturing the lighting device 1 of the first embodiment. First, as shown in FIG. 9A, a mold 501 being formed with a plurality of cavities is provided. Each of the cavities has a plurality of angular surfaces being formed at the bottom. In FIG. 9B, a transparent or a translucent polymeric material is applied into the mold 501 to form a light traveling layer 131 of a light spreading plate with a plurality of light spreading units, wherein each of the light spreading units has a configuration of upside-down dome-shaped body on which a cone-shaped recesses 135 is formed. In FIG. 9C, a light source plate having the substrate 111, the light sources 115, e.g. LED dies encapsulated with encapsulant, the electrode layers 113 and the light scattering layer 117, is inverted onto the mold 501. In this manner, the LED dies and encapsulants can be embedded in the light traveling layer 131 and the top surface of the substrate 111 is contact with the light traveling layer 131 before the transparent (or translucent) polymeric material is cured. As shown in FIG. 9D, the transparent (or translucent) polymeric material is cured to form the light traveling layer 131, and then the mold 501 is removed. As shown in FIG. 9E, this embodiment is characterized in that the light scattering layer 133 is sprayed or coated onto the light traveling layer 131 in advance. Finally, as shown in FIG.

9F, the light diffusing materials are applied to fill up the cone-shaped recess 135 of each of the light spreading units.

Figure 10A:
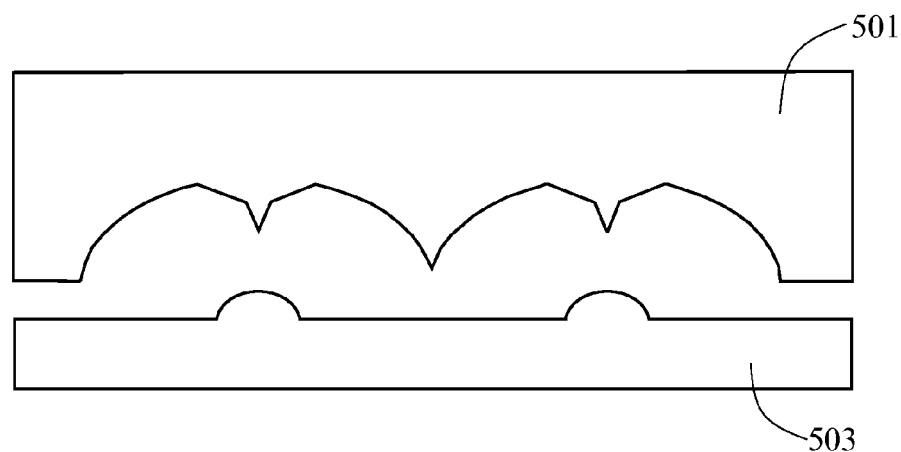
FIGS. 10A to 10G are schematic views illustrating a tenth embodiment of the present invention.
Figure 10B:
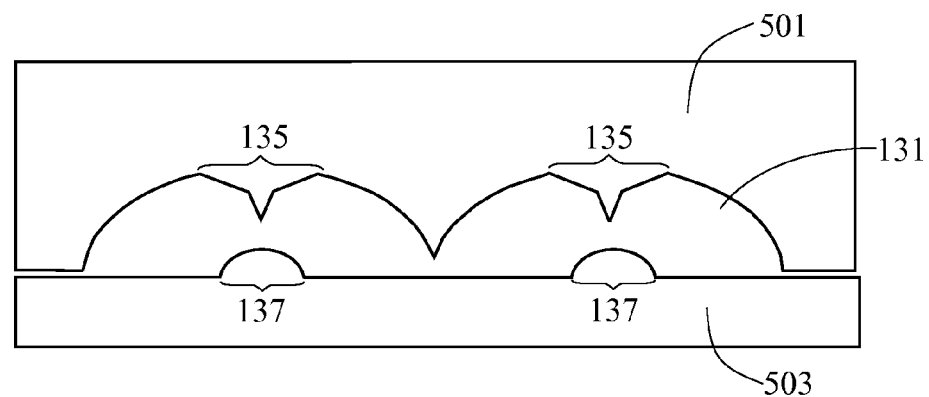
Figure 10C:
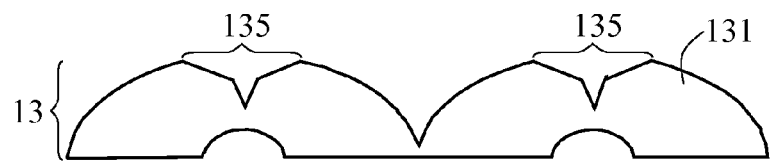
Figure 10D:
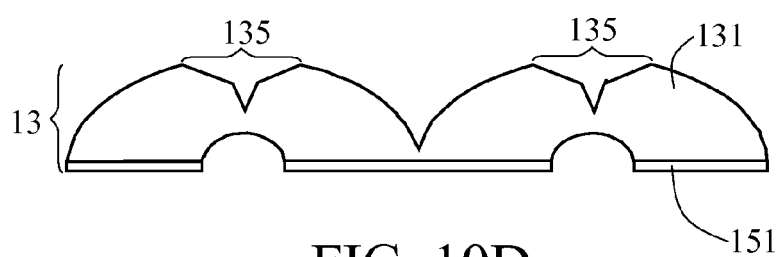
Figure 10E:
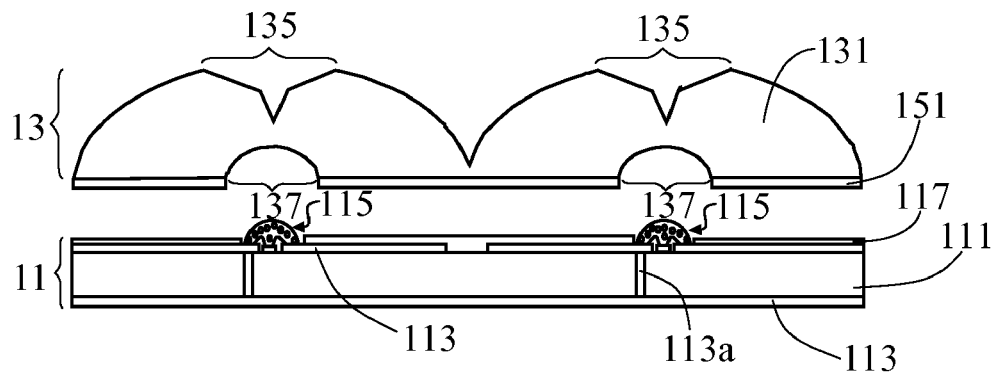
Figure 10F:
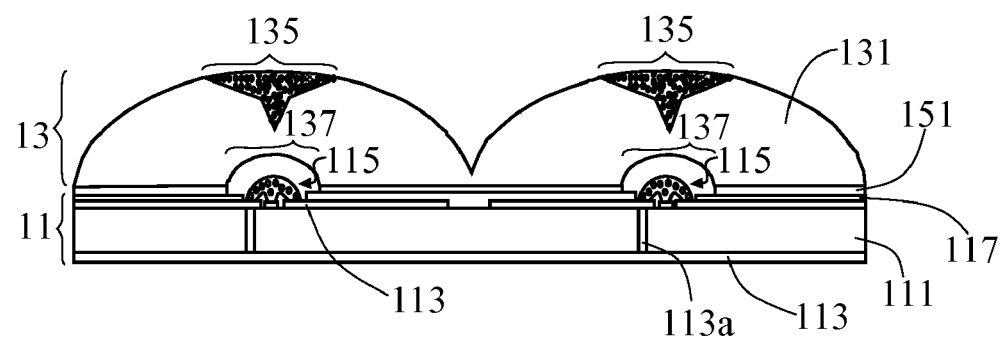
Figure 10G:
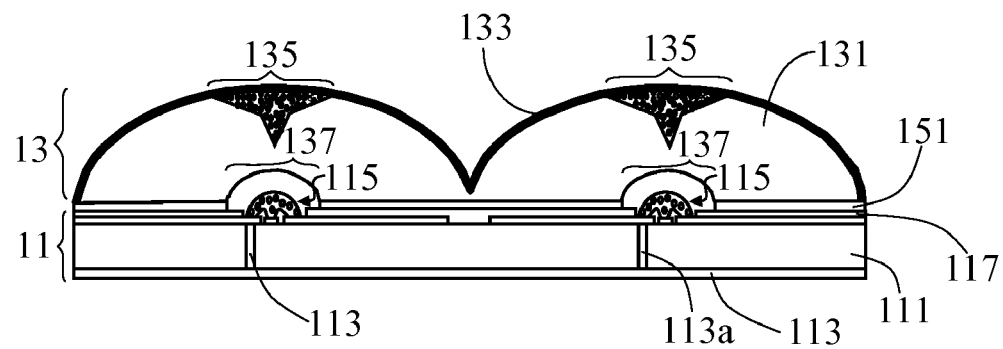

The tenth embodiment of the present invention relates to another method for manufacturing the lighting device 3 of the third embodiment. First, as shown in FIG. 10A, molds 501 and 503 are provided. The mold 501 is formed with a plurality of cavities having a plurality of angular surfaces at the bottom, and the mold 503 has a top surface being formed with protrusions. Next, as shown in FIG. 10B, transparent or translucent polymeric material is injection molded between the molds 501 and 503 to form the light traveling layer 131 of the light spreading plate with a plurality of light spreading units, wherein each of the light spreading units has a dome-shaped body on which a cone-shaped recess 135 is formed by the mold 501 and the bottom surface is formed with a bowl-shaped recess 137 by the mold 503. The transparent (or translucent) polymeric material is cured to form the light traveling layer 131 of the light spreading plate 13. In FIG. 10C, the molds 501 and 503 are subsequently removed. In FIG. 10D, a transparent glue 151 is applied on the bottom side of the light traveling layer 131. In FIG. 10E, the light traveling layer 131 of the light spreading plate 13 is disposed onto the light source plate 11 having the substrate 111, the light sources 115, e.g. LED dies encapsulated with encapsulant, the electrode layers 113 and the light scattering layer 117. In FIG. 10E, light diffusing materials are filled to the cone-shaped recess 135 of each of the light spreading units. Finally, as shown in FIG. 10G, the light scattering layer 133 is coated onto the light traveling layer 131.

Figure 11A:
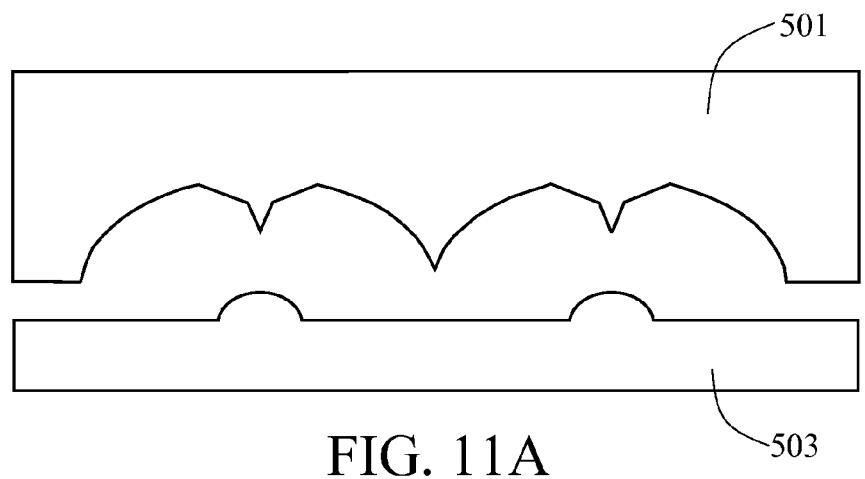
FIGS. 11A to 11G are schematic views illustrating an eleventh embodiment of the present invention.
Figure 11B:
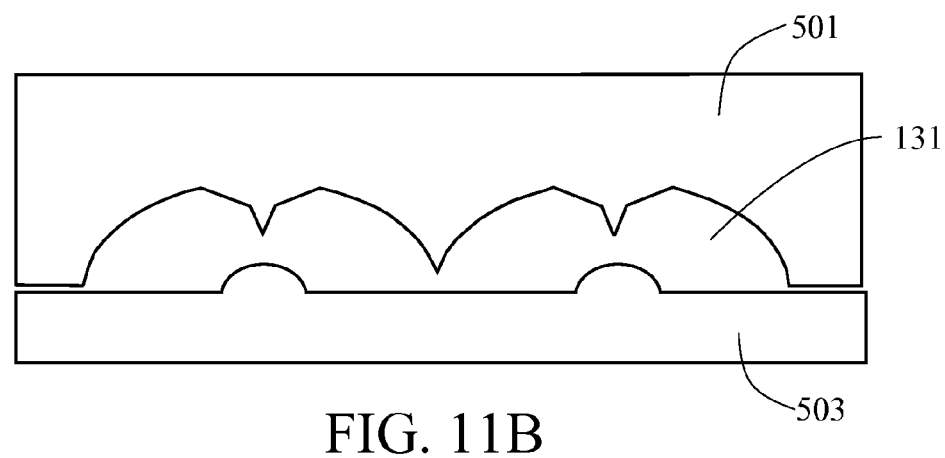
Figure 11C:
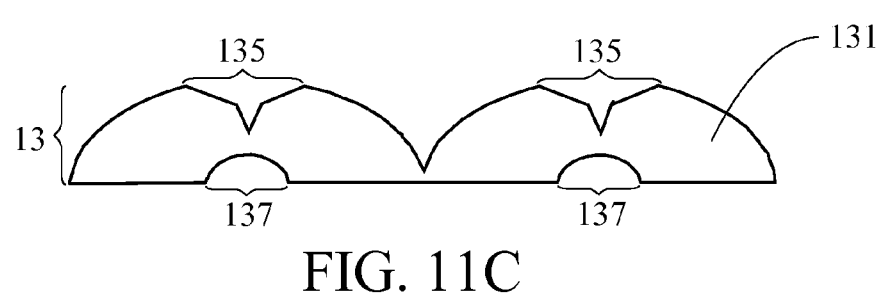
Figure 11D:
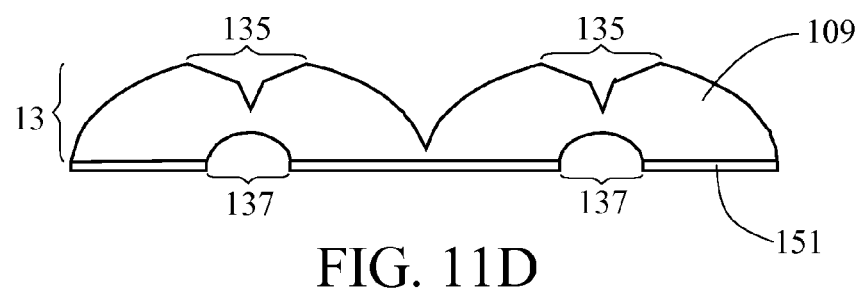
Figure 11E:
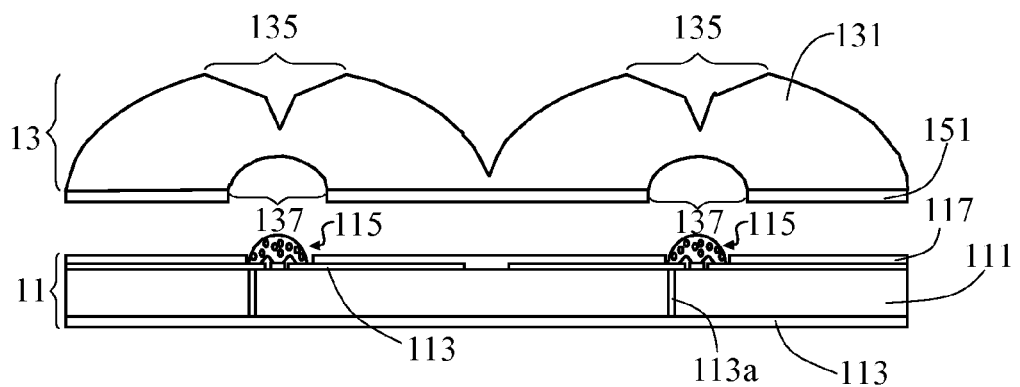
Figure 11F:
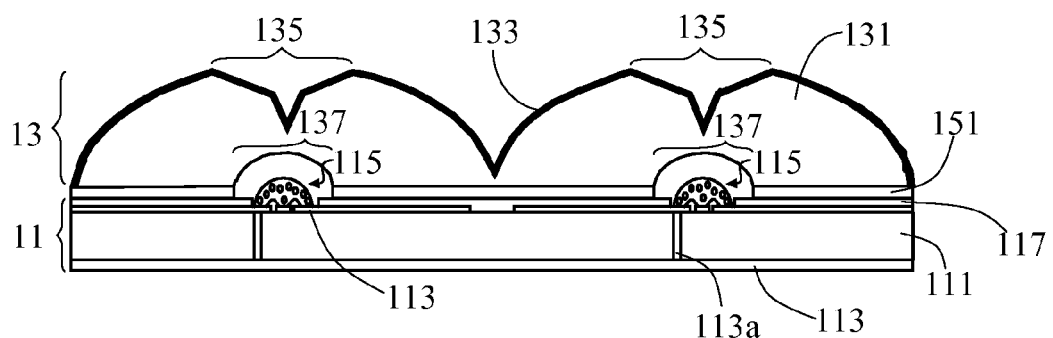
Figure 11G:
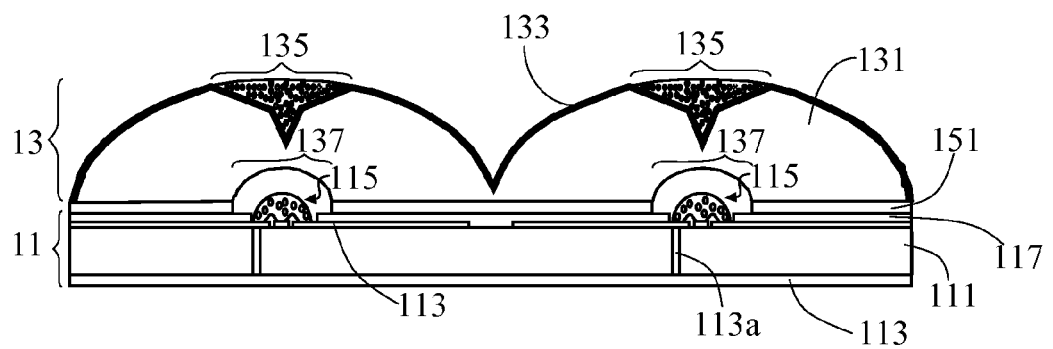

The eleventh embodiment of the present invention relates to another method for manufacturing the lighting device 1 of the first embodiment. The processes illustrated in FIGS. 11A to 11E are similar to those illustrated in FIGS. 10A to 10E and are not superfluously illustrated herein. As shown in FIG. 11F, the light scattering layer 133 is coated onto the light traveling layer 131 in advance. Finally, as shown in FIG. 11G, the light diffusing materials are filled to the cone-shaped recess 135 of each of the light spreading units.

It should be noticed that the sequence of the steps shown in FIGS. 10A to 10E or FIGS. 11A to 11E could be varied by person skilled in the art and are not used to limit the scope of the present invention. For example, the light scattering layer 133 could be coated onto the light traveling layer 131 and the light diffusing materials could be filled into the cone-shaped recess 135 before the light spreading plate 13 is disposed onto the light source plate 11.

Figure 12:
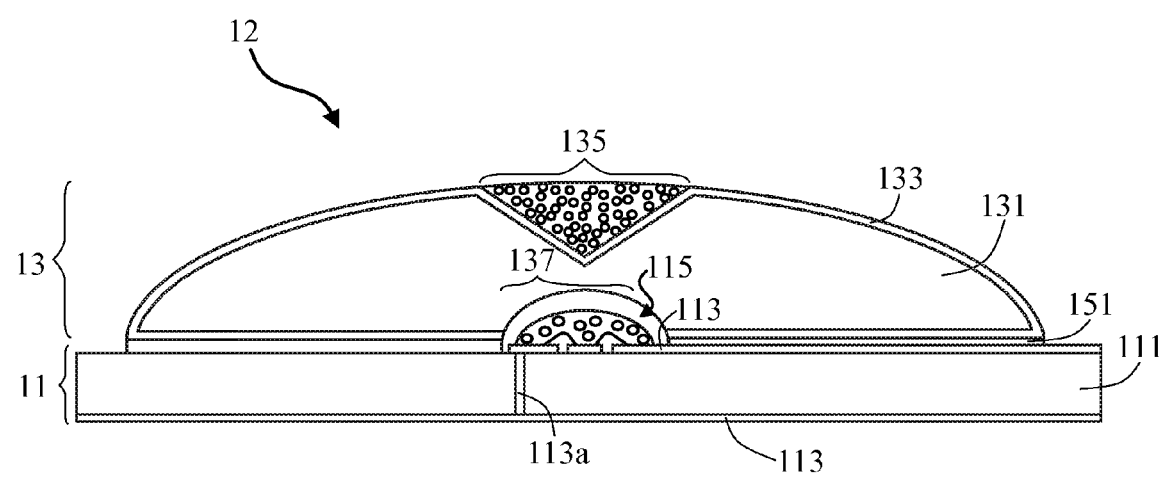
FIG. 12 is a schematic view illustrating another structure of the lighting device of the present invention.
Figure 13A:
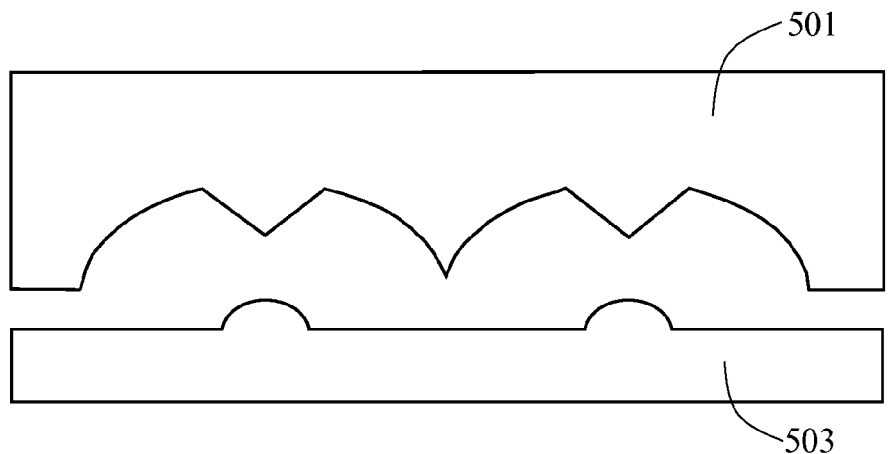
FIGS. 13A to 13G are schematic views illustrating another embodiment of the present invention.
Figure 13B:
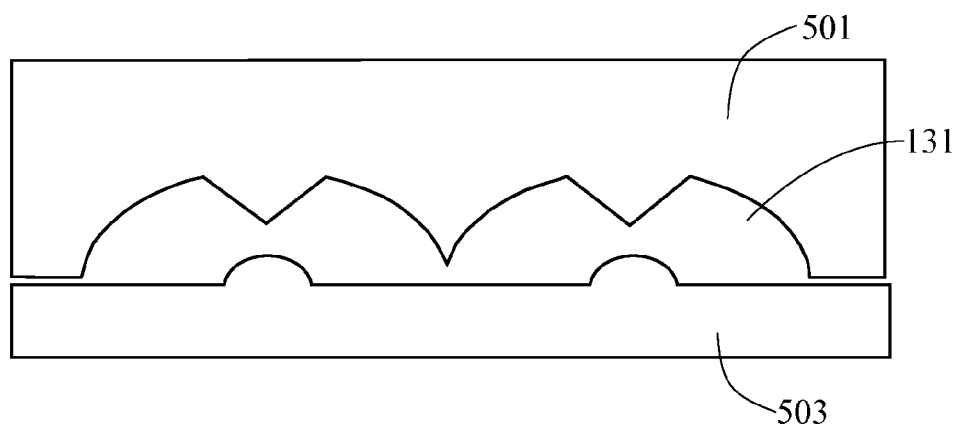
Figure 13C:
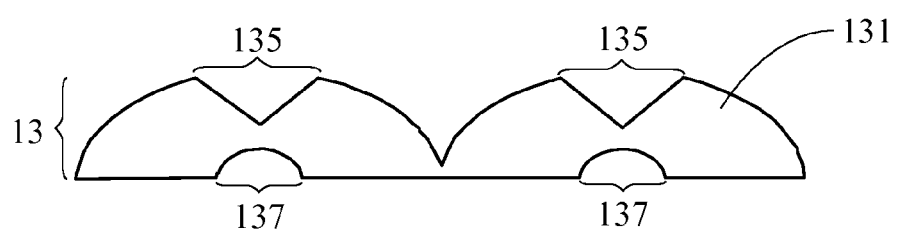
Figure 13D:
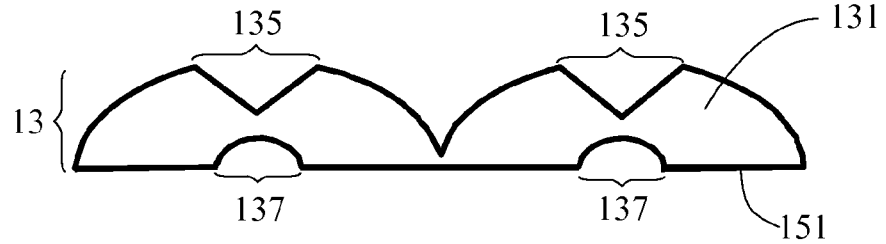
Figure 13E:
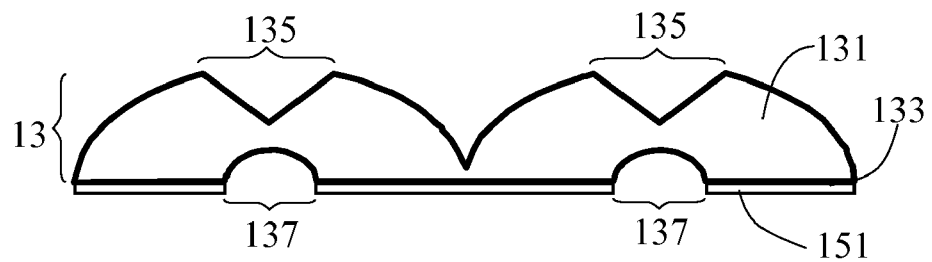
Figure 13F:
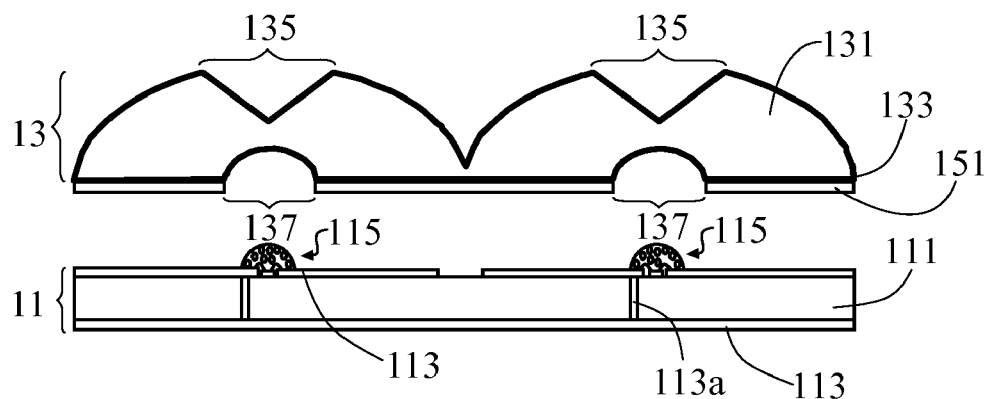
Figure 13G:
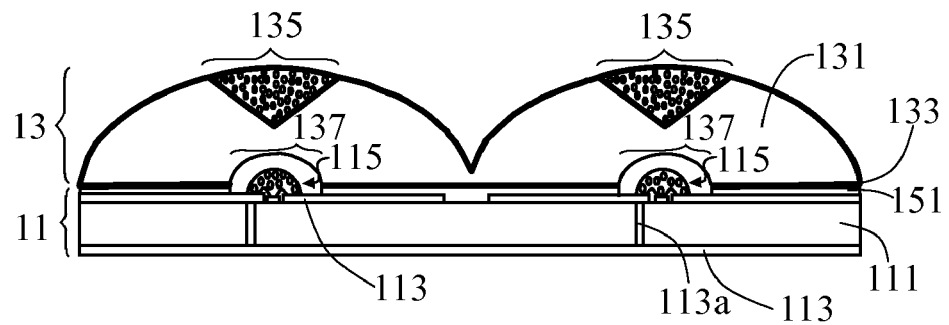

FIG. 12 is another embodiment disclosing the light scattering layer 133 applied to the entire surface (except the area around the bowl-shaped recess 137 which is fitted the light source 115) of the light traveling layer 113. In this case, the light scattering layer 117 can be eliminated. The advantage of this structure is that the entire light traveling layer 131 (except the area around the bowl-shaped recess 137) will be encapsulated by the light scattering layer 133 so that the light can be better mixed and uniformized within the light traveling layer 131. The method for manufacturing the structure having the light scattering layer 133 formed on the bottom surface (except for the area around the bowl-shaped recess 137) of the light traveling layer 131 is illustrated hereinafter. Referring to FIGS. 13A to 13D, after the light traveling layer 131 is injection molded between the molds 501 and 503, the light scattering layer 133 is coated onto both the top surface and the bottom surface the light traveling layer 131. Preferably, the area around the bowl-shaped recess is not coated with the light scattering layer 131. Then, as shown in FIGS. 13E to 13F, the transparent glue 151 is applied on the bottom side of the light traveling layer 131 and the light traveling layer 131 is disposed onto the light source plate 11. Finally, as shown in FIG. 13G, the light diffusing materials are filled within each of the cone-shaped recesses 113 of the light spreading units. Conceivably, the light scattering layer 133 fully coated onto the light traveling layer 131 is practicable.

Figure 14:
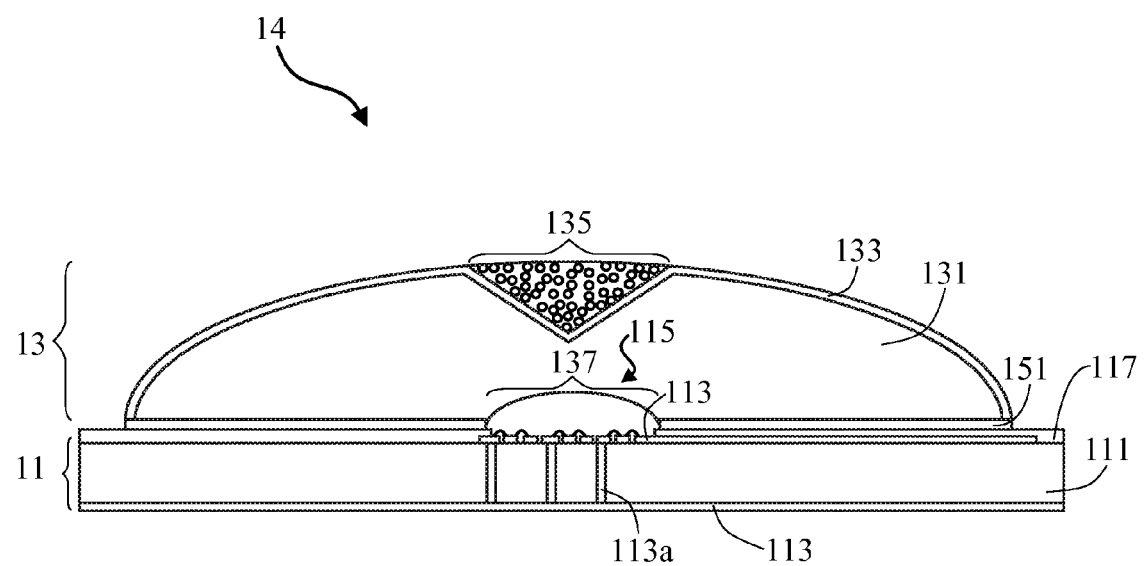
FIG. 14 is a schematic view illustrating the lighting device, each of the light sources of which has a plurality of LEDs.

FIG. 14 shows another preferred embodiment that each of the light spreading units has a plurality of LED dice, which are grouped together as a light source, bonded on the substrate 111 and covered by the bowl-shaped recess 137. In this case, each of the light spreading units will act like a light mixer to uniformly mix different color LED light together. For example, when the unit overlays a red light LED, a green light LED and a blue light LED, it can uniformly mix the RGB light to product white light. In addition, each of the different color light LEDs can be individually selected to provide a single color light, i.e. the red light, the green light or the blue light.

Figure 15:
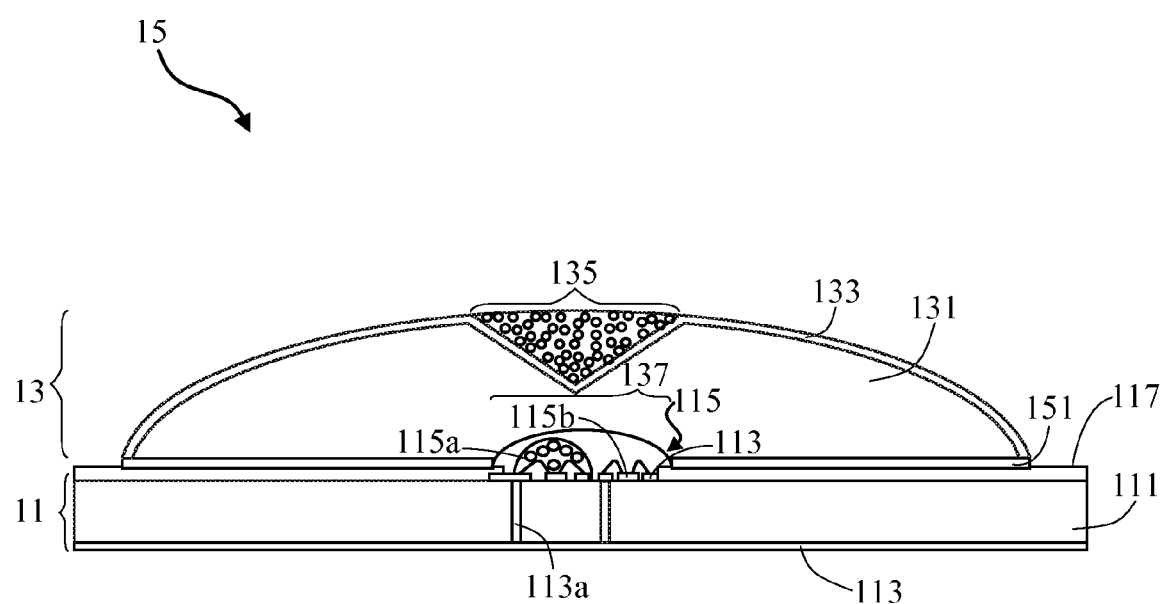
FIG. 15 is a schematic view illustrating the lighting device, each of the light sources of which has a plurality of LEDs.

Similar to FIG. 14, FIG. 15 shows another embodiment having a capability of adjusting color temperature. For example, a white light LED 115a (ex. blue LED die with an encapsulant containing yellow phosphor) and an auxiliary LED 115b (ex. red light LED, yellow light LED, blue light LED or amber light LED) are disposed together on the substrate 111 and covered by the bowl-shaped recess 137. So, by adjusting the intensity of light generated from the white light LED 115a and the auxiliary LED 115b, different color temperature can be produced. The dome-shaped body of each of the light spreading plate 13 provides an excellent channel for mixing different color lights.

Figure 16:
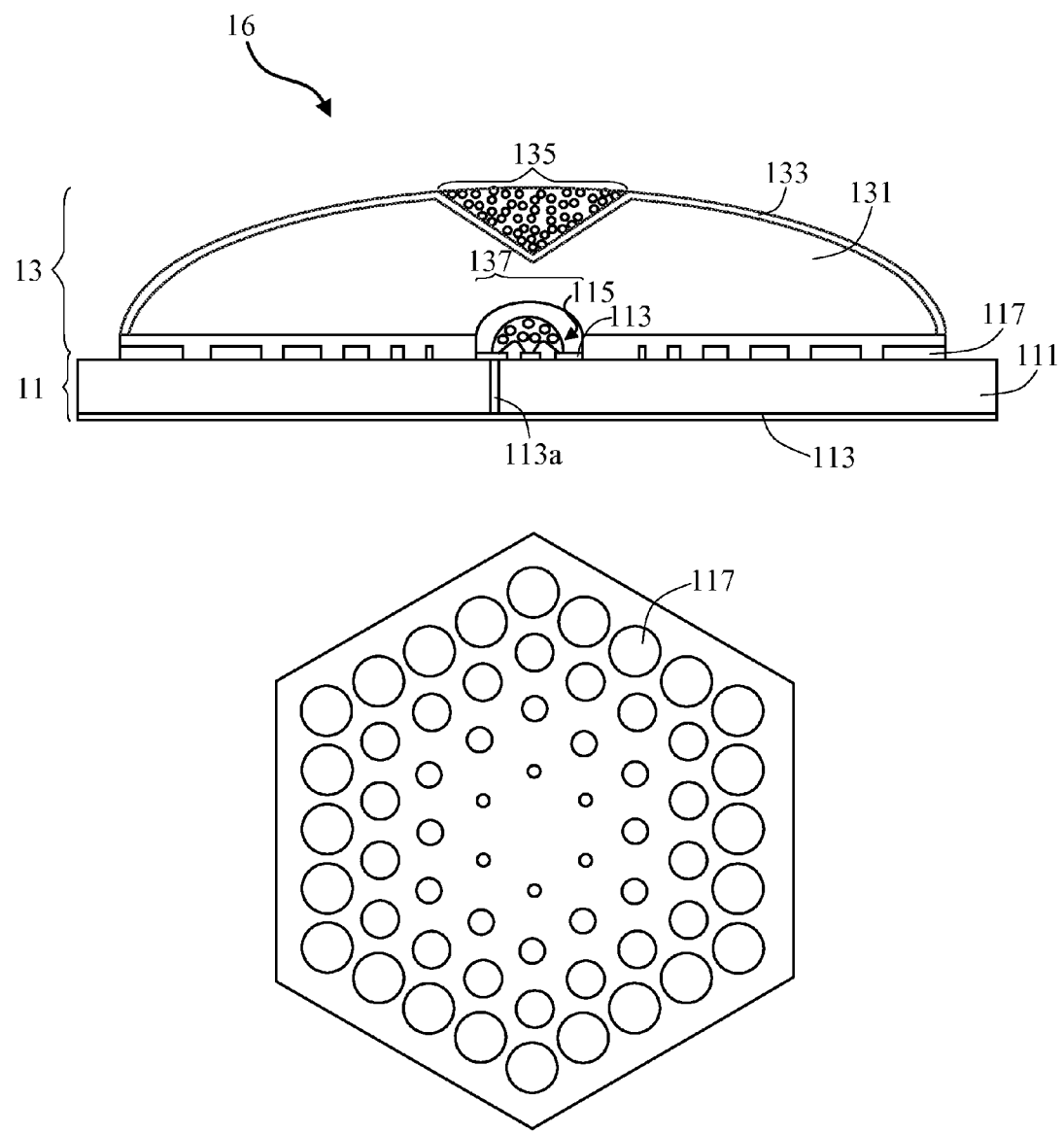
FIG. 16 is a schematic view illustrating the lighting device having a patterned light scattering layer 117.
Figure 17:
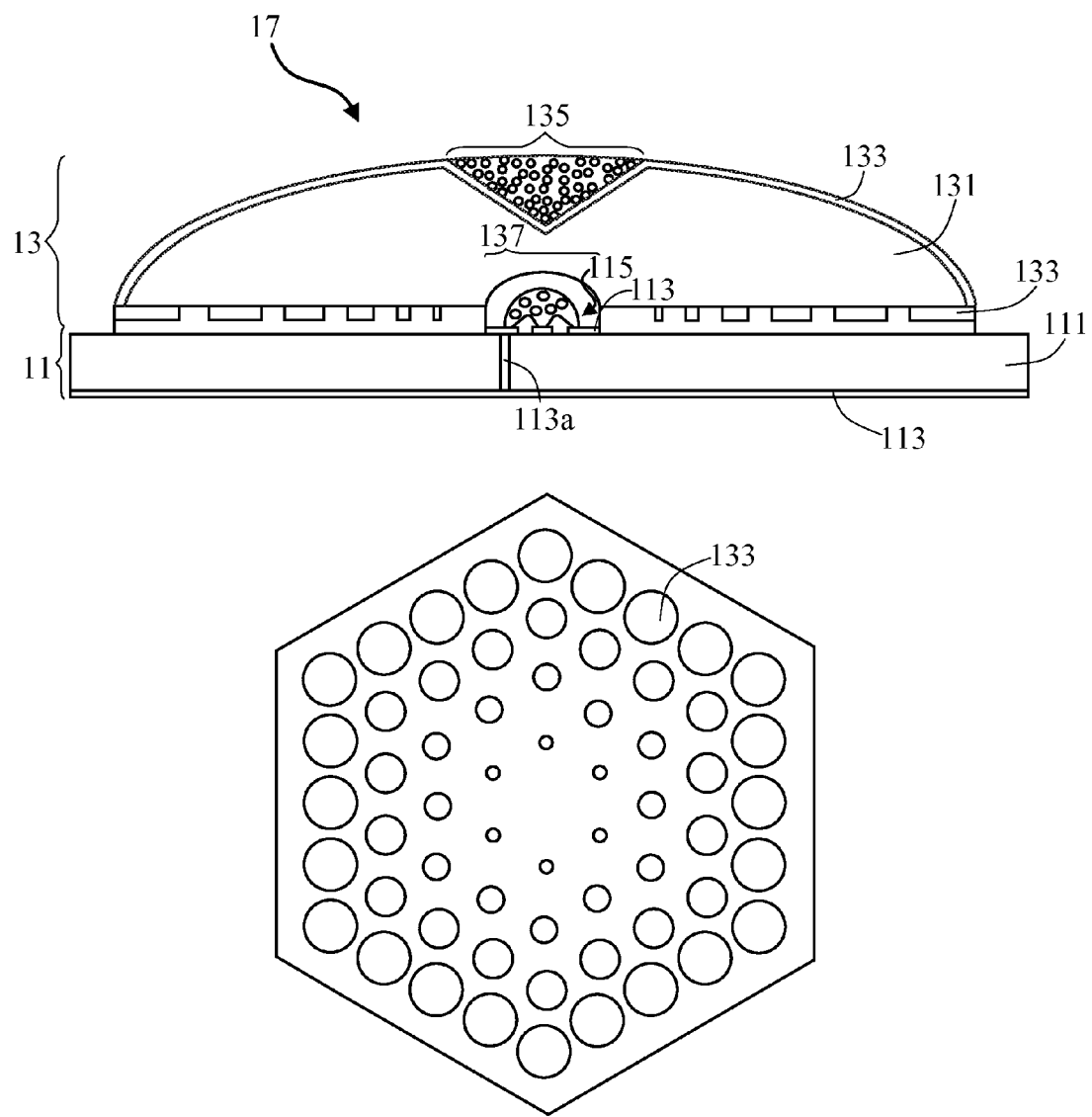
FIG. 17 is a schematic view illustrating the lighting device having a patterned light scattering layer 117.

FIG. 16 shows the cross-sectional view illustrating the lighting device and the top plane view of the light scattering layer 117. The light scattering layer 117 is formed with patterns on the substrate 111 so that the light scattering layer 117 has different coverage from the central region toward the peripheral region. In other words, the patterned light scattering layer 117 has a distribution, that is, the region closer to the light source 115 has less coverage, while the region away from the light source 115 has more coverage. In this way, light will be reflected less at the central region due to smaller coverage of the light scattering layer 117 and the weaker light at the peripheral region will be reflected more due to larger coverage of the light scattering layer 117. Therefore, the patterned light scattering layer 117 can provide additional enhancement to uniformize the overall light output in addition to the dome-shaped body of each of the light spreading units. The patterned light scattering layer 117 can be fabricated by any traditional printing processes such as screening printing, gravure printing, flexo printing, stamp printing and inkjet printing. Similarly, when the light scattering layer 117 is eliminated as shown in FIG. 17, the patterned light scattering layer 117 can also be applied to the light scattering layer 133 which is further coated onto the bottom surface (except for the area around the bowl-shaped recess 137) of the light traveling layer 131.

Figure 18A:
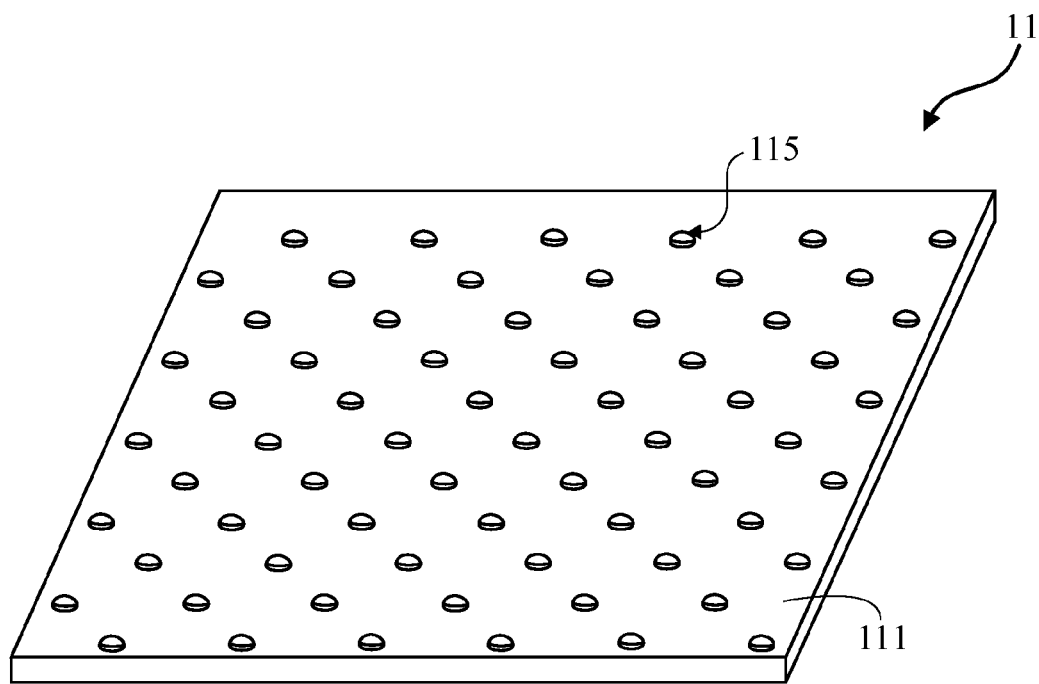
FIGS. 18A to 18D are schematic views illustrating the structure of the lighting device of the present invention.
Figure 18B:
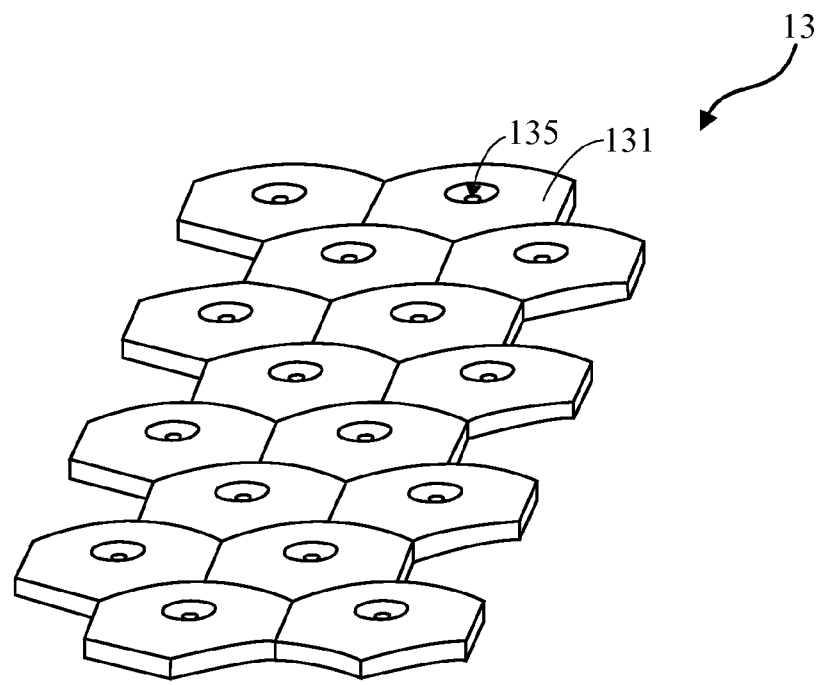
Figure 18C:
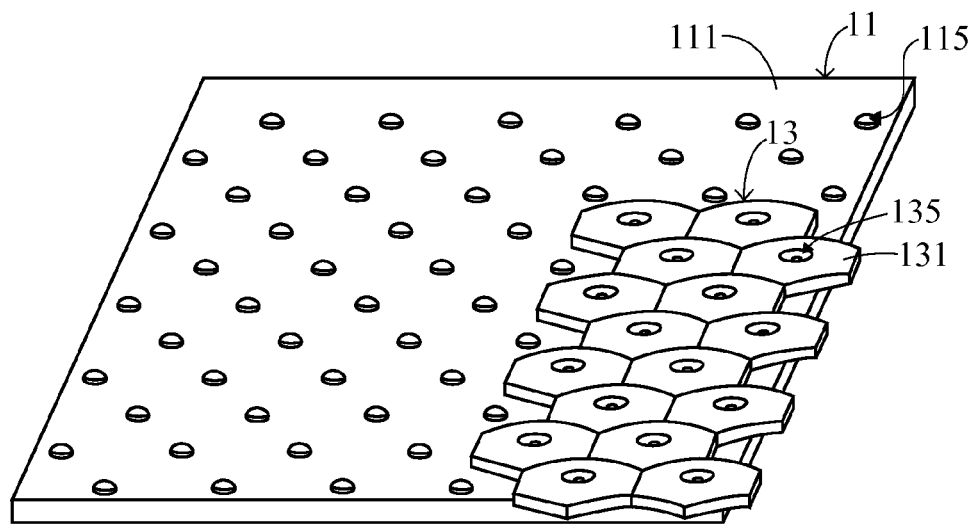
Figure 18D:
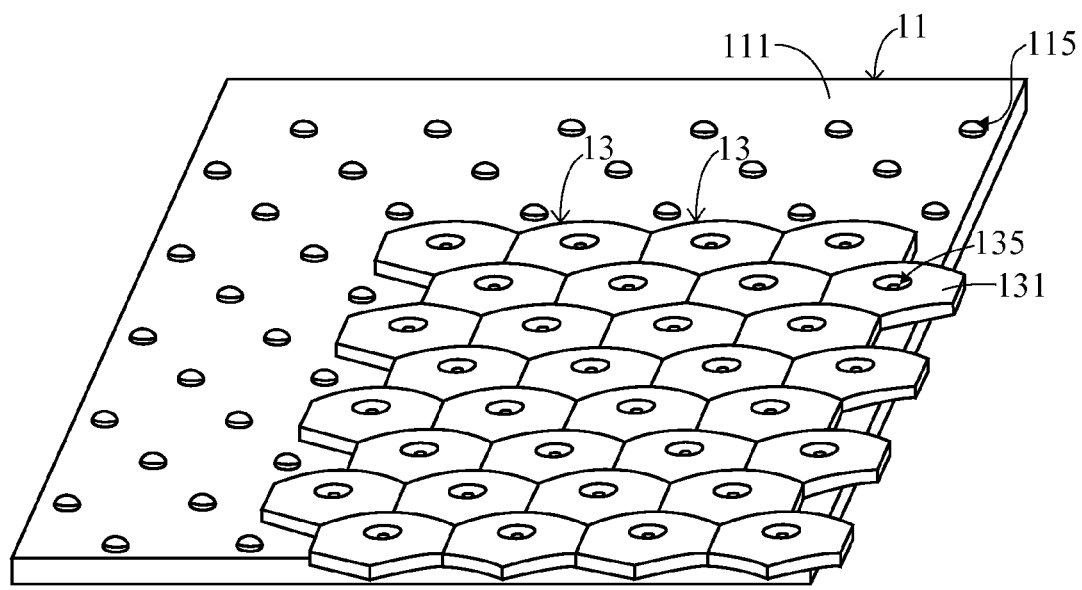

FIG. 18A to FIG. 18F are schematic views illustrating the lighting device of the present invention. FIG. 18A illustrates a light source plate 11 in which light sources 115, e.g. LED dies encapsulated by applying encapsulant, disposed on a substrate 111, e.g. a PCB substrate. FIG. 18B illustrates the light spreading plate 13 in which light traveling layer 131 including a plurality of dome-shaped light spreading units connected and arranged with each other, for example, in a configuration of honeycomb. FIG. 18C illustrates the light spreading plate 13 is assembled onto the light source plate 11. Conceivably, a plurality of the light spreading plates 13 can be individually manufactured and then tiled up with each other in a seamless way, as shown in FIG. 8D. It is noted that the dome-shaped light spreading units filled with light diffusing materials are designed and arranged according to the pitches of the light sources.

Figure 19:
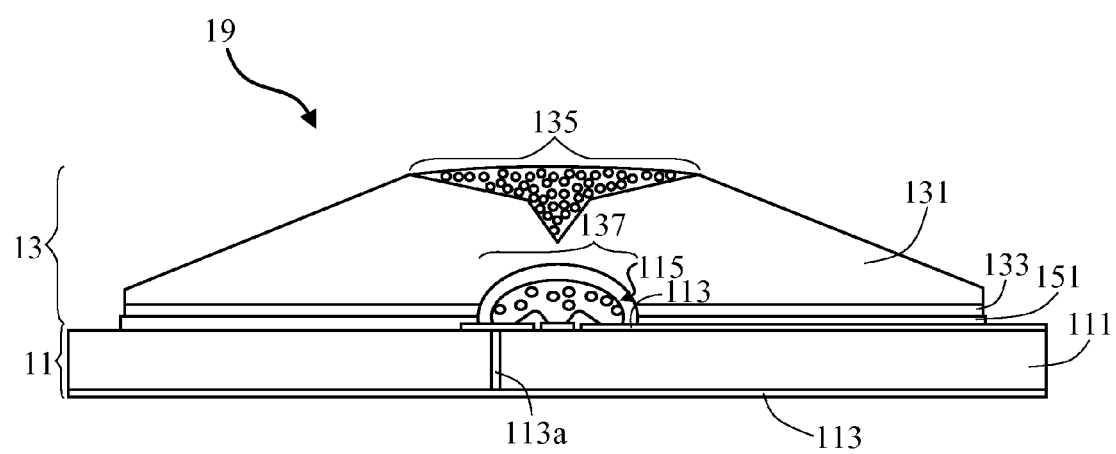
FIGS. 19 to 21 are schematic views illustrating the lighting device in various configurations.
Figure 20:
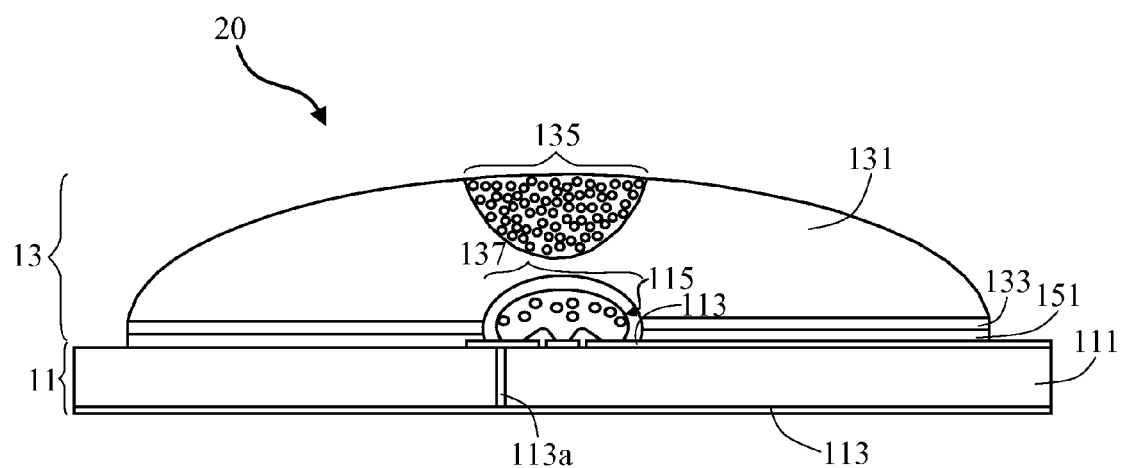
Figure 21:
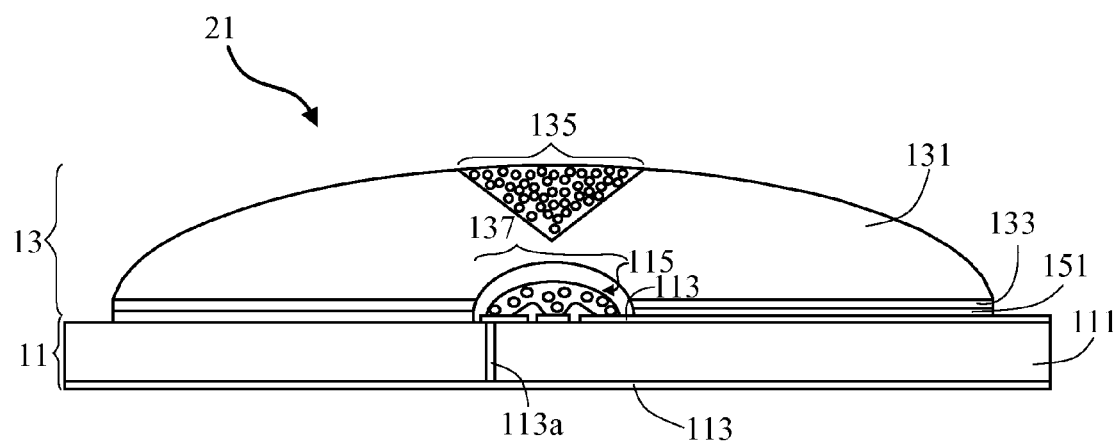

FIGS. 19 to 21 illustrate various lighting devices having the light scattering layer 133 merely formed on the bottom surface (except the area around the bowl-shaped recess 137) of the light traveling layer 131. As shown in FIG. 19, the light spreading plate 13 of the lighting device 19 has the upper surface being not cambered but inclined and the bottom surface coated with the light scattering layer 133. As shown in FIG. 20, the upper surface of the light spreading plate 13 of the lighting device 20 is cambered and the cone-shaped recess 135 is smoothed as a bowl. As shown in FIG. 21, the upper surface of the light spreading plate 13 of the lighting device 21 is cambered and the cone-shaped recess 135 is triangular. In these embodiments, the top surface of the light traveling layer 131 is dimmed to scatter the light.

Figure 22:
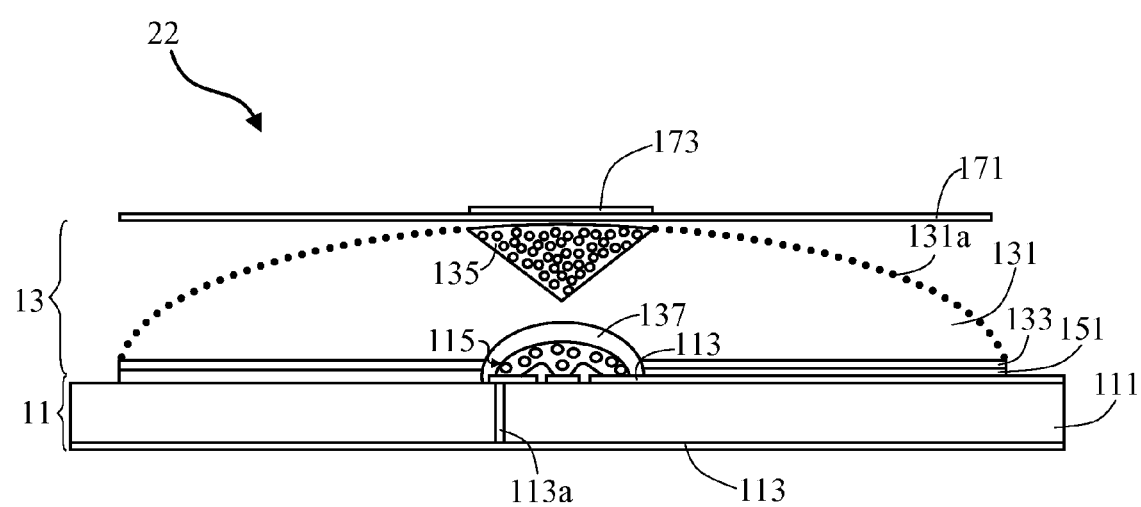
FIGS. 22 to 27 are schematic views illustrating the lighting device having the optical film in various configurations.
Figure 23:
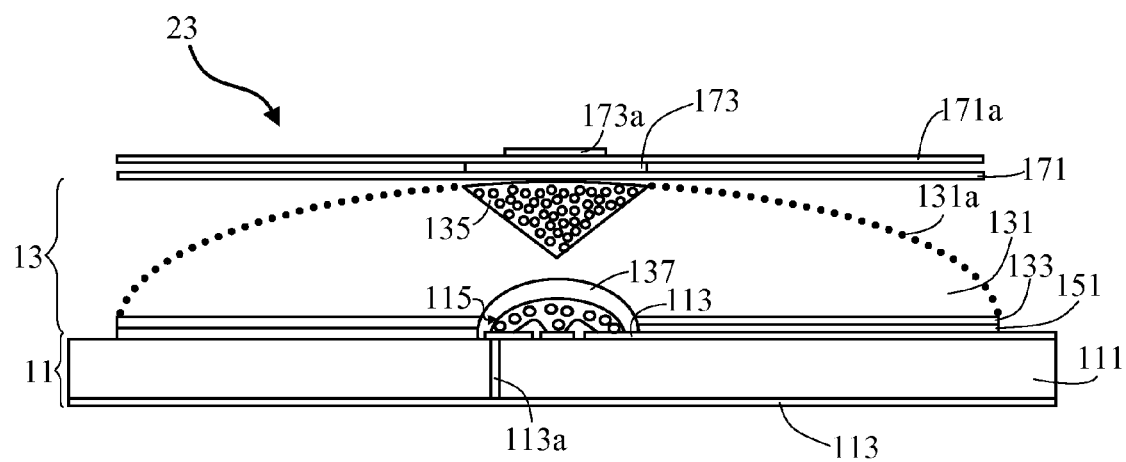

Other preferred embodiments are shown in FIGS. 22 to 27. In these embodiments, the bottom surface (except for the area around the bowl-shaped recess 137) of the light traveling layer 131 is coated with the light scattering layer 133, and the cambered top surface of the light traveling layer 131 is a matt surface 131a. The matt surface 131a can be formed by sanding, rubbing, mechanical polish or mechanical etching. As shown in FIG. 22, an optical film 171 is disposed on the light spreading plate 13. The optical film 171 is formed with the pattern 173 which is located with respect to the light source 115. Preferably, the pattern 173 is a patterned light scattering material (e.g. polymeric resin containing TiO2 particles) coating which is formed on to a clear plastic film. The pattern 173 is utilized to further scattering the light traveling along the normal of the substrate 111 to obtain a better uniformity. As shown in FIG. 23, two optical films 171, 171a are stacked and disposed above the light spreading plate 13. The optical film 171 is formed with the pattern 173 and the optical film 171a is formed with the pattern 173a. The patterns 173, 173a are overlaid and located with respect to the light source 115 for scattering the light traveling along the normal of the substrate 111. Preferably, the patterns 173, 173a are light scattering material (e.g. polymeric resin containing TiO2 particles) coatings respectively formed on the optical film 171, 171a.

Figure 24:
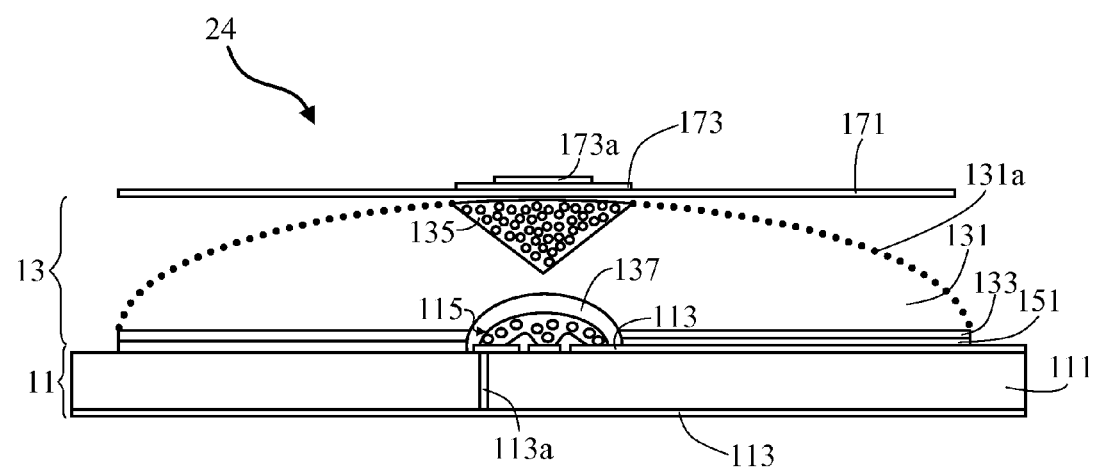
Figure 25:
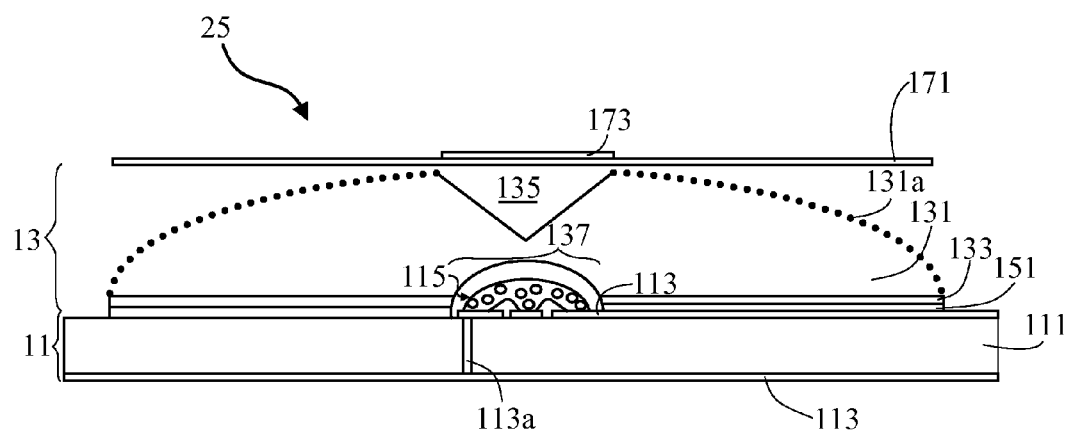
Figure 26:
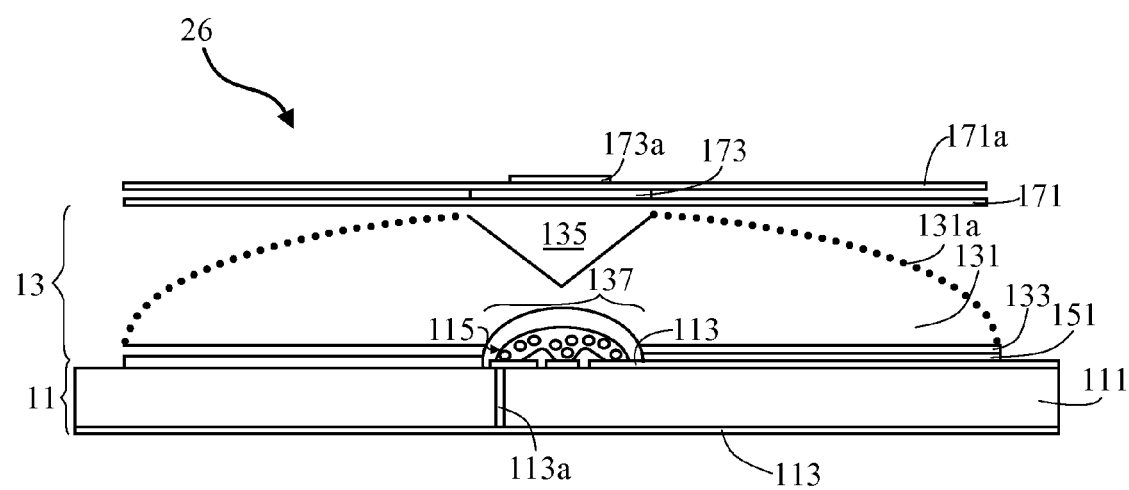
Figure 27:
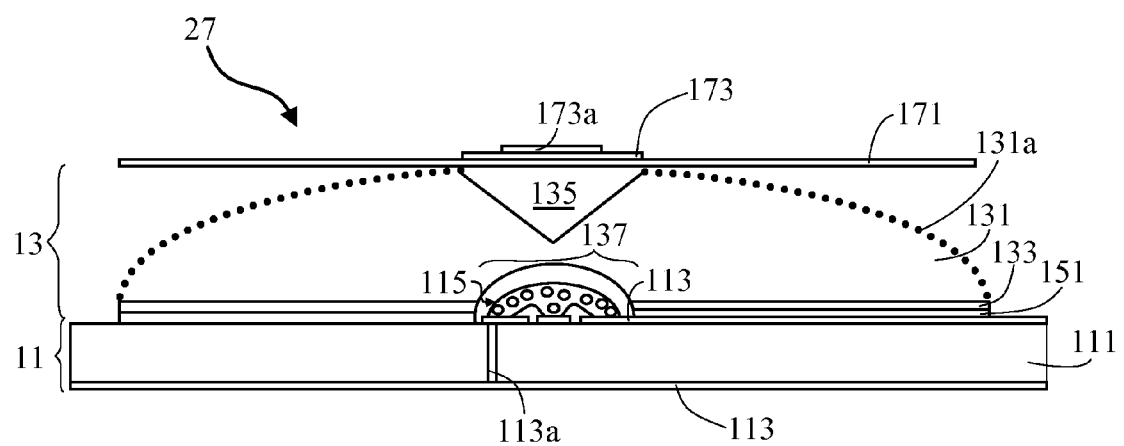

As shown in FIG. 24, the optical film 173 is formed with the pattern 173, 173a. The patterns 173, 173a are overlaid and located with respect to the light source 115 for scattering the light traveling along the normal of the substrate 111. Preferably, the patterns 173, 173a are light scattering material (e.g. polymeric resin containing TiO2 particles) coatings respectively formed on the optical film 171. FIGS. 25 to 27 show the embodiments similar to those in FIGS. 22 to 24. In these embodiments, the optical film 171 (171a) scatters the light to uniform the light so that there is no need to fill the light diffusing material within the cone-shaped recess 135.

Figure 28:
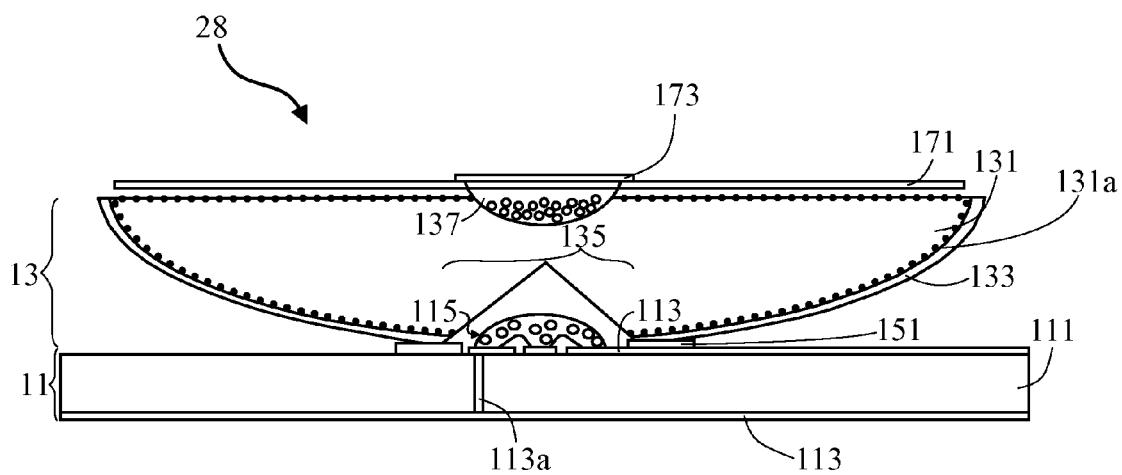
FIGS. 28 to 33 are schematic views illustrating the lighting device in which the light spreading plate is upside-down disposed onto the light source plate.
Figure 29:
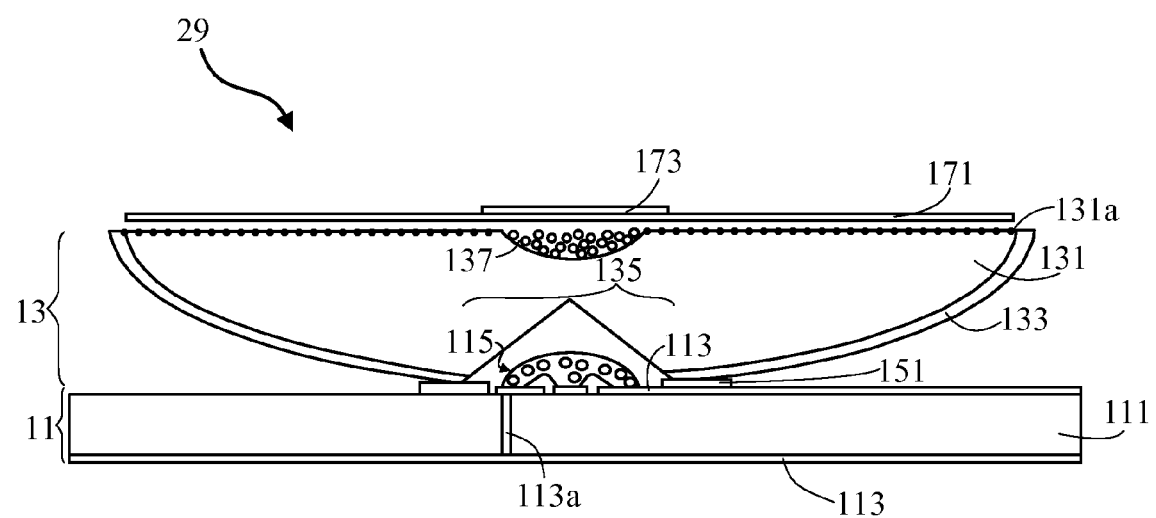
Figure 30:
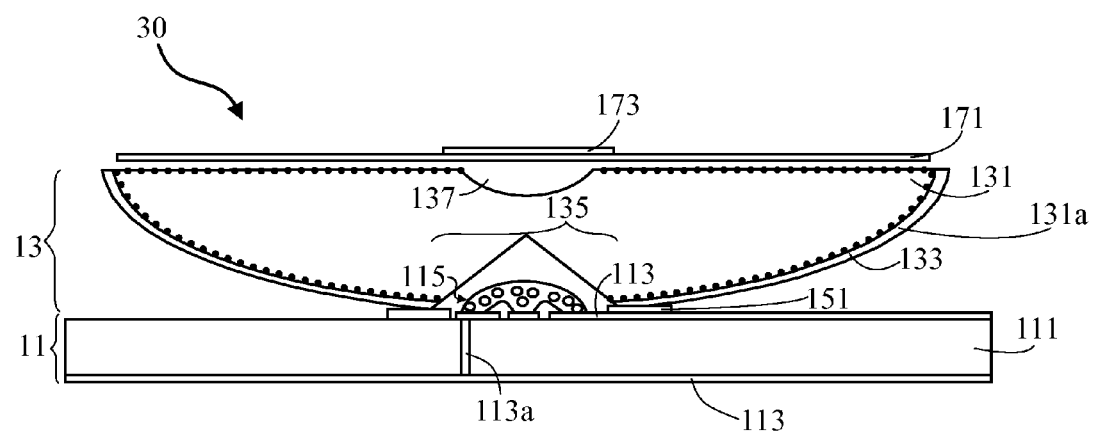
Figure 31:
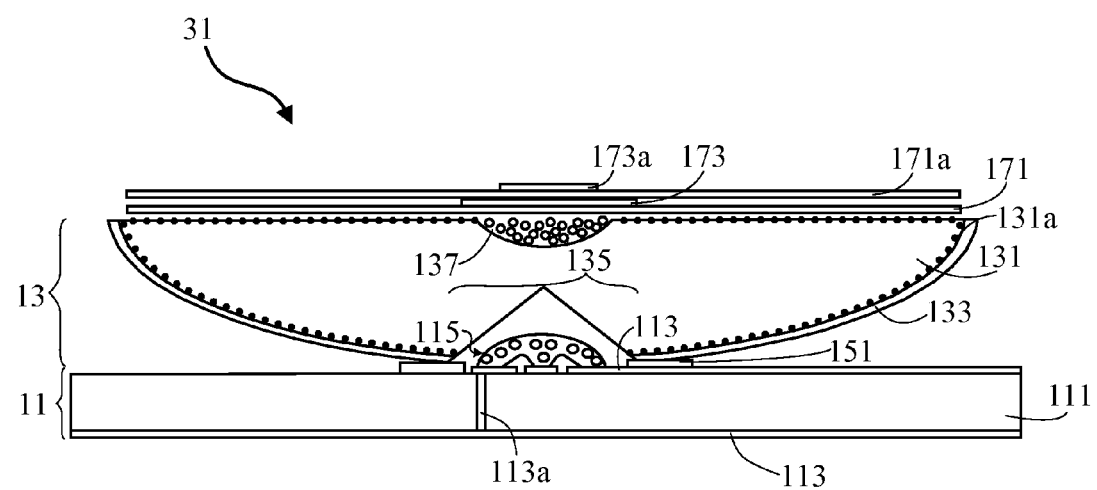
Figure 32:
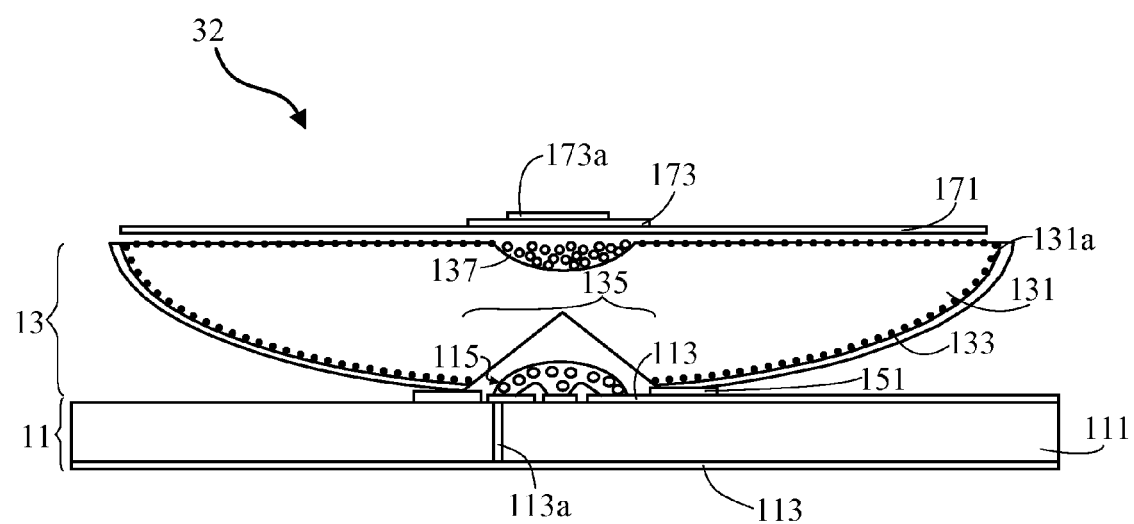

FIGS. 28 to 34 show other preferred embodiments of the present invention. The light spreading plate 13 is upside-down disposed onto the light source plate 11 so that the t cone-shaped recess 135 with the triangular configuration faces to the light source 115. As shown in FIG. 28, the entire surface (except the areas around the cone-shaped recess 135 and the bowl-shaped recess 137) of the light traveling layer 131 is a matt surface 131a. The bottom surface (except the area around the cone-shaped recess 135) is then coated with the light scattering layer 133. The optical film 171 formed with the pattern 173 being located with respect to the light source 115 is disposed on the light spreading plate 13. Preferably, the pattern 173 is a patterned light scattering material (e.g. polymeric resin containing TiO2 particles) coating which is formed on to a clear plastic film. FIG. 29 shows another embodiment that only the top surface (except the bowl-shaped recess 137) of the light travelling layer 131 is the matt surface 131a. FIG. 30 shows an embodiment that the optical film 171 scatters the light to uniform the light so that there is no need to fill the light diffusing material within the bowl-shaped recess 137. As shown in FIG. 31, two optical films 171, 171a are stacked and disposed above the light spreading plate 13. The optical film 171 is formed with the pattern 173 and the optical film 171a is formed with the pattern 173a. The patterns 173, 173a are overlaid and located with respect to the light source 115 for scattering the light which was traveling along the normal of the substrate 111. As shown in FIG. 32, the optical film 171 is formed with the pattern 173, 173a. The patterns 173, 173a are overlaid and located with respect to the light source 115 for scattering the light traveling along the normal of the substrate 111.

Figure 33:
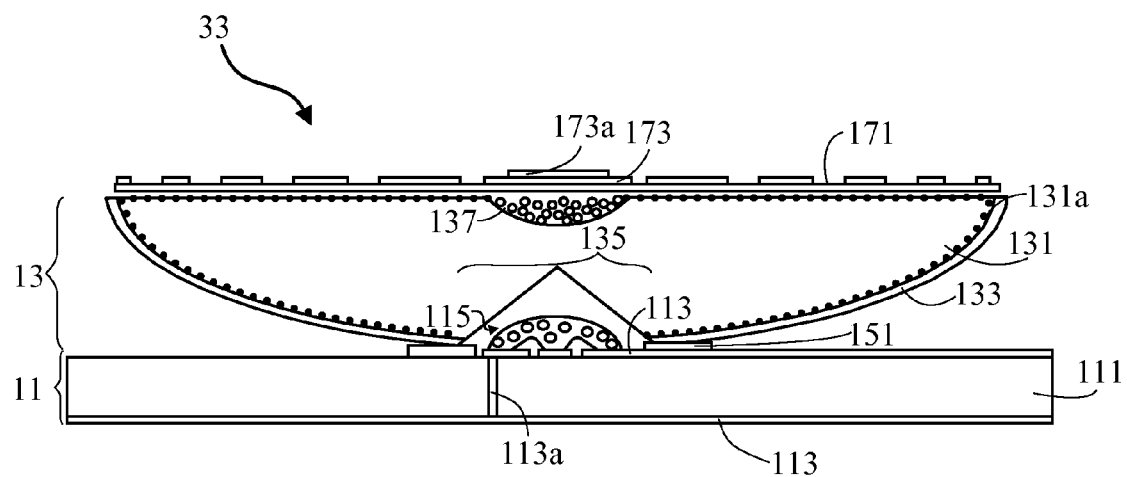
Figure 33:
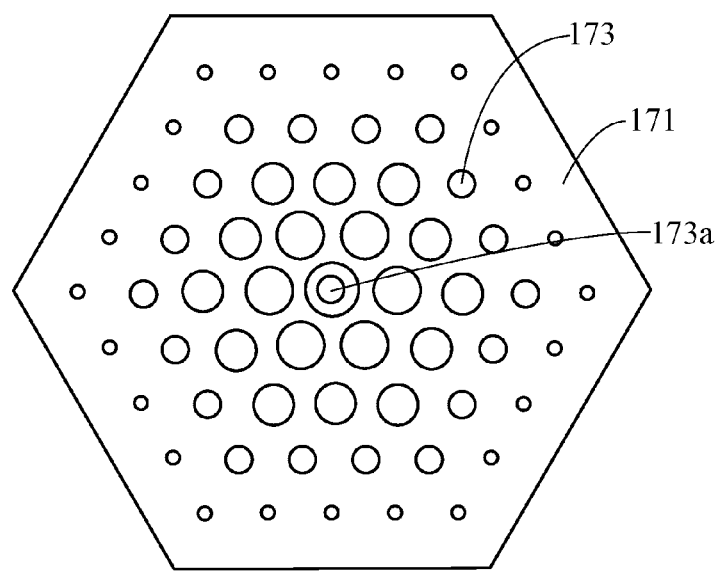

FIG. 33 shows another preferred embodiment in which the cross-sectional view illustrating the lighting device 33 and the top plane view of the optical film 171. The optical film 171 is formed with pattern 173, 173a, so that the optical film 171 has different coverage from the central region toward the peripheral region. In other words, the patterned optical film 171 has a distribution, that is, the region closer to the light source 115 has more coverage while the region away from the light source 115 has less coverage. In this way, light will be scattered more at the central region due to larger coverage of the optical film 171 and the weaker light at the peripheral region will be scattered less due to less coverage of the optical film 171. Therefore, the patterned optical film 171 can provide additional enhancement to uniformize the overall light output in addition to the light spreading plate 13. The patterned optical film 171 can be fabricated by any traditional printing processes such as screening printing, gravure printing, flexo printing, stamp printing and inkjet printing.

Figure 34A:
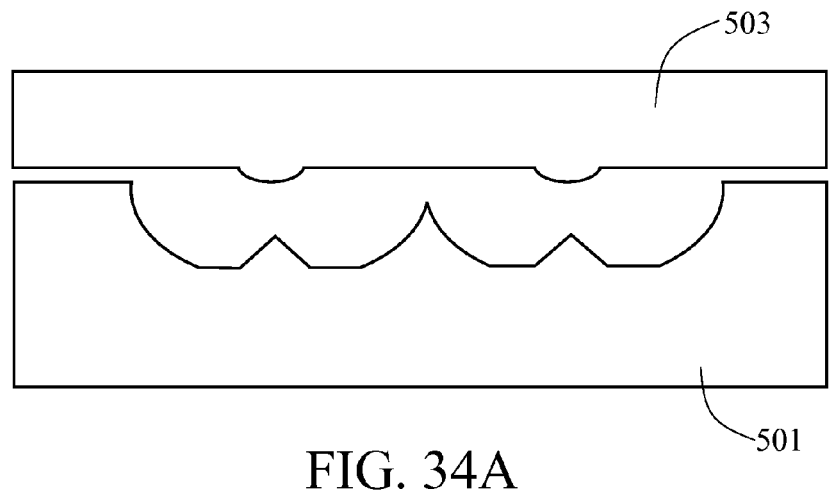
FIGS. 34A to 34H are schematic views illustrating another preferred method of manufacturing the lighting device.
Figure 34B:
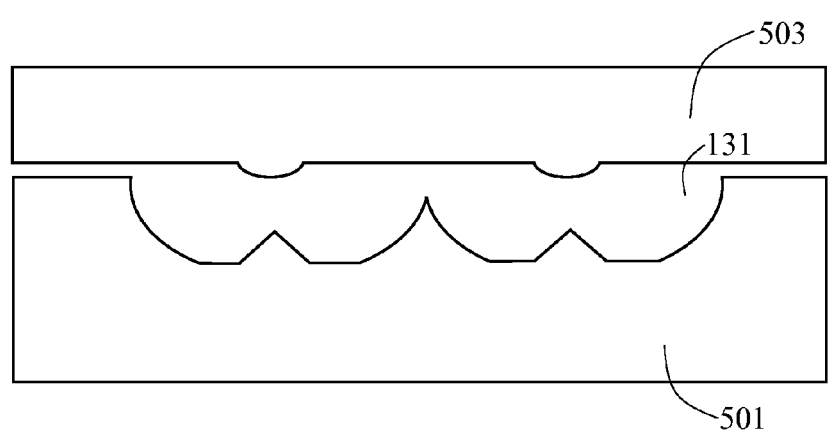
Figure 34C:
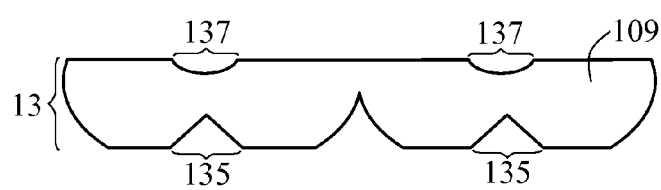
Figure 34D:
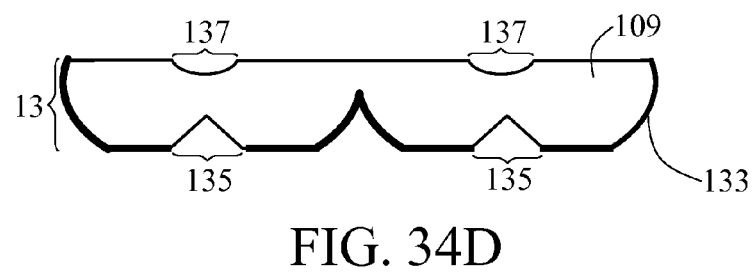
Figure 34E:
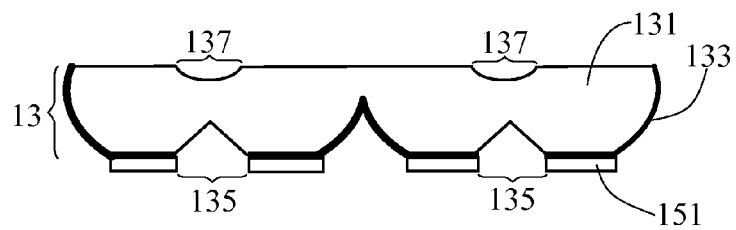
Figure 34F:
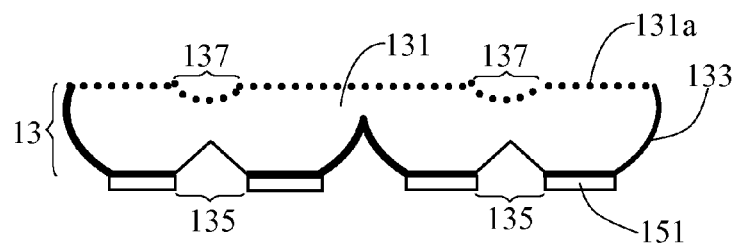
Figure 34G:
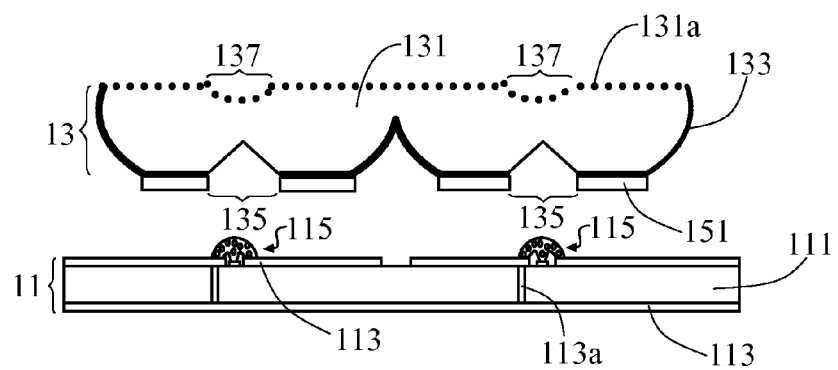
Figure 34H:
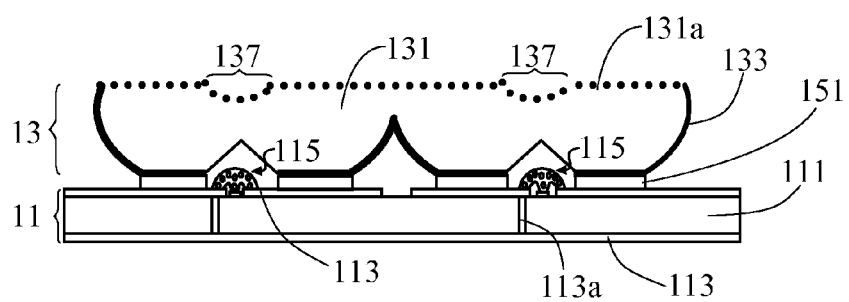

A method for manufacturing the lighting device is shown in FIGS. 34A to 34G. As shown in FIGS. 34A, 34B and 34C, transparent (or translucent) polymeric material is injection molded between the molds 501 and 503 to form the light traveling layer 131 of the light spreading plate 13 with a plurality of light spreading units, wherein each of the units has a upside-down dome-shaped body on which a cambered bottom surface with a cone-shaped recess 135 is formed by the mold 501 and the flat top surface is formed with a bowl-shaped recess 137 by the mold 503. The transparent (or translucent) polymeric material is cured to form the light traveling layer 131. In FIG. 34D, the light traveling layer 131 is partially coated with the light scattering layer 133. Then, in FIG. 34E, the transparent glue 151 is applied on the bottom side of the light traveling 131. In FIG. 34F, the top surface of the light traveling layer 131 is formed into a matt surface 131a. Finally, as shown in FIGS. 34G and 34H, the light traveling layer 133 of the light spreading plate 13 is adhered onto the substrate 111 of the light source plate 11.

Given the above, the direct-lit lighting device suitable for large-scale product application is disclosed. The lighting device with the light spreading plate is able to produce a uniform surface light within an ultra thin configuration.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A light spreading plate, comprising:
    a light traveling layer including a plurality of light spreading units, each of the light spreading units comprising a main body being defined with a top surface, a bottom surface and a peripheral, the main body having a thickness being tapered towards the peripheral, wherein the light spreading units are integrally formed and continuously connected with each other in a configuration of a honeycomb;
    wherein the top surface is formed with a first recess, the bottom surface is formed with a second recess opposite to the first recess, and one of the first recess and the second recess is utilized to accommodate a light source.

2. The light spreading plate as claimed in claim 1, further comprising a light scattering layer being coated onto the light traveling layer, wherein the lighting scattering layer is made of a polymer resin containing light scattering particles with differentiable refractive index, the light scattering particles are selected from a group of titanium dioxide particles, calcium carbonate particles, silica oxide particles, aluminum oxide particles, zinc oxide particles, tin oxide particles, germanium oxide particles, polymeric particle, metallic particles, and air microvoids.

3. The light spreading plate as claimed in claim 1, wherein each of the first recesses is filled with a light diffusing material and each of the second recess is utilized to accommodate the light source.

4. The light spreading plate as claimed in claim 3, wherein the lighting diffusion material is made of transparent or translucent polymeric materials containing light scattering particles with differentiable refractive index, wherein the light scattering particles are selected from a group of titanium dioxide particles, calcium carbonate particles, silica oxide particles aluminum oxide particles, zinc oxide particles, tin oxide particles, germanium oxide particles, polymeric particle, metallic particles, and air microvoids.

5. The light spreading plate as claimed in claim 1, wherein each of the first recesses is a cone-shaped recess and a tip of each of the cone-shaped recesses is sharp.

6. The light spreading plate as claimed in claim 1, wherein each of the first recesses is a cone-shape recess and a tip of each of the cone-shaped recesses is rounded.

7. The light spreading plate as claimed in claim 1, wherein the light traveling layer is made of a polymeric material which is selected from a group of silicon rubber, polyurethane, polystyrene, polyester, polycarbonate, polyimide, cyclic olefin copolymer, polyacrylic resin, polymethylmethacrylate (PMMA), acrylonitrile butadiene styrene (ABS), polyvinylchloride (PVC), polyethylene (PE) and polypropylene (PP).

8. The light spreading plate as claimed in claim 1, wherein the top surface of each of the spreading units is a matt surface.

9. The light spreading plate as claimed in claim 1, wherein the main body is a dome-shaped body.

10. A lighting device, comprising:
    a light source plate having a substrate, an electrode layer patterned on the substrate, and a plurality of light sources bonded to be electrically connected with the electrode layer; and
    a light spreading plate being disposed onto the light source plate, the light spreading plate having a light traveling layer being formed with a plurality of light spreading units, each of the light spreading units comprising a main body being defined with a top surface, a bottom surface and a peripheral, the main body having a thickness being tapered towards the peripheral, wherein the light spreading units are integrally formed and continuously connected with each other in a configuration of a honeycomb;
    wherein the top surface is formed with a first recess, the bottom surface is formed with a second recess opposite to the first recess, and one of the first recess and the second recess is utilized to accommodate one of the light sources so that the first recess and the second recess are disposed with respect to one of the light sources when the light spreading plate is disposed onto the light source plate.

11. The lighting device as claimed in claim 10, wherein the substrate is a printed circuit board (PCB) or a flexible printed circuit board (FPC).

12. The lighting device as claimed in claim 10, wherein each of the light sources is an encapsulant enclosing the at least one LED die, the at least one LED die is selected from a group of a red LED die, a green LED die, a blue LED die, an amber LED die and a UV LED die.

13. The lighting device as claimed in claim 12, wherein the encapsulant is a mixture of a transparent polymer resin and at least one phosphor material.

14. The lighting device as claimed in claim 10, wherein each of the light sources is a SMD packaged LED.

15. The lighting device as claimed in claim 10, further comprising a first light scattering layer being coated onto the light traveling layer.

16. The lighting device as claimed in claim 15, further comprising a second light scattering layer coated onto the substrate and the electrode layer on areas outside the light sources.

17. The lighting device as claimed in claim 16, wherein the second light scattering layer is formed with a pattern which is located with respect to each of the light sources.

18. The lighting device as claimed in claim 16, wherein the first light scattering layer and the second light scattering layer are made of a polymer resin containing light scattering particles with differentiable refractive index, wherein the light scattering particles are selected from a group of titanium dioxide particles, calcium carbonate particles, silica oxide particles, aluminum oxide particles, zinc oxide particles, tin oxide particles, germanium oxide particles, polymeric particle, metallic particles, and air microvoids.

19. The lighting device as claimed in claim 10, wherein each of the first recesses is filled with a light diffusing material and each of the second recess is utilized to accommodate one of the light sources.

20. The lighting device as claimed in claim 19, wherein the lighting diffusion material is made of transparent polymer materials containing light scattering particles with differentiable refractive index, wherein the light scattering particles are selected from a group of titanium dioxide particles, calcium carbonate particles, silica oxide particles aluminum oxide particles, zinc oxide particles, tin oxide particles, germanium oxide particles, polymeric particle, metallic particles, and air microvoids.

21. The lighting device as claimed in claim 10, wherein each of the first recesses is a cone-shaped recess and a tip of each of the cone-shaped recesses is sharp.

22. The lighting device as claimed in claim 10, wherein each of the first recesses is a cone-shaped recess and a tip of each of the cone-shaped recesses is rounded.

23. The lighting device as claimed in claim 10, wherein the top surface of each of the spreading units is a matt surface.

24. The lighting device as claimed in claim 10, wherein the light traveling layer is made of a polymeric material which is selected from a group of silicon rubber, polyurethane, polystyrene, polyester, polycarbonate, polyimide, cyclic olefin copolymer, polyacrylic resin, polymethylmethacrylate (PMMA), acrylonitrile butadiene styrene (ABS), polyvinylchloride (PVC), polyethylene (PE) and polypropylene (PP).

25. The lighting device as claimed in claim 10, further comprising an optical film disposed on the light traveling layer, wherein the optical film is formed with a pattern which is located with respect to each of the light sources.

26. The lighting device as claimed in claim 24, wherein the pattern is a patterned light scattering material which is coated on a clear plastic film to form the optical film, wherein the patterned light scattering material is made of a polymer resin containing light scattering particles with differentiable refractive index, the light scattering particles are selected from a group of titanium dioxide particles, calcium carbonate particles, silica oxide particles aluminum oxide particles, zinc oxide particles, tin oxide particles, germanium oxide particles, polymeric particle, metallic particles, and air microvoids.

27. The light device as claimed in claim 10, wherein the main body is a dome-shaped body.

* * * * *